(12) United States Patent
Yamamoto

(10) Patent No.: US 11,823,623 B2
(45) Date of Patent: Nov. 21, 2023

(54) DISPLAY DEVICE INCLUDING PIXEL CIRCUITS WITH DIFFERENT TRANSISTOR TYPES AND METHOD FOR DRIVING SAME

(71) Applicant: Sharp Kabushiki Kaisha, Sakai (JP)

(72) Inventor: Kaoru Yamamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/642,785

(22) PCT Filed: Sep. 17, 2019

(86) PCT No.: PCT/JP2019/036281
§ 371 (c)(1),
(2) Date: Mar. 14, 2022

(87) PCT Pub. No.: WO2021/053770
PCT Pub. Date: Mar. 25, 2021

(65) Prior Publication Data
US 2022/0392403 A1   Dec. 8, 2022

(51) Int. Cl.
*G09G 3/3233* (2016.01)
*G09G 3/3266* (2016.01)
*G09G 3/3275* (2016.01)

(52) U.S. Cl.
CPC ......... *G09G 3/3233* (2013.01); *G09G 3/3266* (2013.01); *G09G 3/3275* (2013.01); *G09G 2300/0842* (2013.01); *G09G 2310/0278* (2013.01)

(58) Field of Classification Search
CPC .................................................... G09G 3/3233
USPC .......................................................... 345/204
See application file for complete search history.

(56) References Cited

U.S. PATENT DOCUMENTS

| 9,443,464 B2 | 9/2016 | Song et al. |
| 2012/0001896 A1 | 1/2012 | Han et al. |
| 2014/0145918 A1 | 5/2014 | Kwak |
| 2017/0352328 A1 | 12/2017 | Jeong et al. |
| 2018/0144811 A1* | 5/2018 | Han ..................... G11C 19/287 |
| 2018/0350891 A1 | 12/2018 | Kim et al. |

(Continued)

FOREIGN PATENT DOCUMENTS

JP  2017-227880 A  12/2017

*Primary Examiner* — Long D Pham
(74) *Attorney, Agent, or Firm* — KEATING & BENNETT, LLP

(57) ABSTRACT

A display device that includes pixel circuits, in each of which a plurality of types of transistors coexist, and that operates normally is implemented while suppressing an increase in processing cost.
Each unit circuit includes a first control circuit (311), a first output circuit (321), and a second output circuit (322). The first output circuit (321) includes a first output terminal (38) connected to a first scanning signal line; a P-type transistor (M4) having a control terminal connected to a first internal node (N1), a first conductive terminal to which a gate high potential (VGH) is provided, and a second conductive terminal connected to the first output terminal (38); and a N-type transistor (M5) having a control terminal connected to the first internal node (N1), a first conductive terminal connected to the first output terminal (38), and a second conductive terminal to which a gate low potential (VGL) is provided.

19 Claims, 27 Drawing Sheets

(56) References Cited

U.S. PATENT DOCUMENTS

2019/0073955 A1 3/2019 Zou et al.
2020/0105198 A1* 4/2020 Park ................ G09G 3/3275

* cited by examiner

DISPLAY DEVICE INCLUDING PIXEL CIRCUITS WITH DIFFERENT TRANSISTOR TYPES AND METHOD FOR DRIVING SAME

TECHNICAL FIELD

The following disclosure relates to a display device and a method for driving the display device, and more specifically to a display device including pixel circuits, in each of which a plurality of types of transistors coexist, and a method for driving the display device.

BACKGROUND ART

In recent years, an organic EL display device including pixel circuits each including an organic EL element has been put to practical use. The organic EL element is also called an organic light-emitting diode (OLED), and is a self-emissive display element that emits light at luminance determined based on a current flowing therethrough. As such, since the organic EL element is a self-emissive display element, the organic EL display device can easily achieve slimming down, a reduction in power consumption, an increase in luminance, etc., compared to a liquid crystal display device that requires a backlight, a color filter, and the like.

For the pixel circuit of the organic EL display device, typically, a thin-film transistor (TFT) is adopted as a drive transistor for controlling supply of a current to the organic EL element. However, variations are likely to occur in the characteristics of the thin-film transistor. Specifically, variations are likely to occur in threshold voltage. If threshold voltage variations occur in the drive transistors provided in a display unit, then variations occur in luminance, degrading display quality. Hence, there are proposed various types of processes (compensation processes) for compensating for variations in threshold voltage.

For schemes for compensation processes, there are known an internal compensation scheme that performs a compensation process by providing, in a pixel circuit, a capacitor for holding information on a threshold voltage of a drive transistor; and an external compensation scheme that performs a compensation process by, for example, measuring, by a circuit provided external to a pixel circuit, the magnitude of a current flowing through a drive transistor under a predetermined condition, and correcting a video signal based on a result of the measurement.

As a pixel circuit of an organic EL display device that adopts the internal compensation scheme for a compensation process, there is known a pixel circuit 90 including one organic EL element 91, seven thin-film transistors T91 to T97, and one capacitor C9, such as that shown in, for example, FIG. 28. As a material of channel layers of the thin-film transistors T91 to T97, for example, low temperature polysilicon (LIPS) is adopted. In addition, in general, the thin-film transistors T91 to T97 are all P-type (p-channel type) thin-film transistors. Therefore, for a gate driver that controls operation of the pixel circuit 90, too, thin-film transistors of only P-type are used. For example, in FIG. 8 of Japanese Laid-Open Patent Publication No. 2017-227880 there is disclosed a configuration of a unit circuit in a gate driver of an organic EL display device including pixel circuits having the same configuration as the pixel circuit 90 shown in FIG. 28. Transistors in the unit circuit all are of P-type. In addition, in FIGS. 3 and 5 accompanying the specification of U.S. Pat. No. 9,443,464, too, there are disclosed circuit diagrams of unit circuits formed using thin-film transistors of only P-type.

PRIOR ART DOCUMENTS

Patent Documents

[Patent Document 1] Japanese Laid-Open Patent Publication No. 2017-227880
[Patent Document 2] U.S. Pat. No. 9,443,464

SUMMARY

Problems to be Solved by the Invention

Meanwhile, in recent years, a thin-film transistor that uses an oxide semiconductor as a material of a channel layer (hereinafter, referred to as "oxide TFT".) has been receiving attention. In terms of being able to achieve an increase in resolution and a reduction in power consumption, there is an increasing tendency to adopt oxide TFTs as thin-film transistors included in the pixel circuits and drive circuits of a display device. For the oxide TFT, typically, the thin-film transistor containing indium gallium zinc oxide (InGaZnO) (hereinafter, referred to as "IGZO-TFT".) is adopted. On the other hand, regarding the thin-film transistor that uses low temperature polysilicon as a material of a channel layer (hereinafter, referred to as "LTPS-TFT".), since the LTPS-TFT has high mobility, there are an advantage in that high-speed driving can be performed and an advantage in that narrowing of a picture-frame of a panel is easily achieved.

In view of the above-described circumstances, LTPS-TFTs and IGZO-TFTs may be allowed to coexist in a pixel circuit. That is, some of the LTPS-TFTs provided in the known pixel circuit 90 may be replaced by IGZO-TFTs. Regarding this, for the IGZO-TFTs, IGZO-TFTs that can be used in practice for N-type (n-channel type) have been fabricated, but IGZO-TFTs that can be used in practice for P-type have not been fabricated. Thus, in a case where an IGZO-TFT is provided in a pixel circuit, the IGZO-TFT is naturally of N-type. In addition, as described above, in general, the thin-film transistors T91 to T97 in the known pixel circuit 90 all are of P-type (see FIG. 28). Thus, if some of the LTPS-TFTs provided in the known pixel circuit 90 are replaced by IGZO-TFTs, then N-type TFTs and P-type TFTs coexist in the pixel circuit. Accordingly, there arises a need to generate, by the gate driver, a signal that controls the N-type TFTs (hereinafter, referred to as "N-type control signal".) and a signal that controls the P-type TFTs (hereinafter, referred to as "P-type control signal".). It is possible to generate the N-type control signal and the P-type control signal by adopting a configuration using CMOS, but adoption of this configuration causes an increase in processing cost.

Hence, an object of the following disclosure is to implement a display device that includes pixel circuits, in each of which a plurality of types of transistors coexist (e.g., a pixel circuit in which IGZO-TFTs and LTPS-TFTs coexist or a pixel circuit in which N-type transistors and P-type transistors coexist) and that operates normally, while suppressing an increase in processing cost.

Means for Solving the Problems

A display device according to some embodiments of the present disclosure is a display device including a pixel circuit including a display element driven by a current, the display device including:

a pixel matrix of i rows×j columns including i×j pixel circuits, with i and j being an integer greater than or equal to 2;

i first scanning signal lines;

i second scanning signal lines; and j data signal lines, wherein the pixel circuit includes:

the display element;

a drive transistor having a control terminal, a first conductive terminal, and a second conductive terminal, and provided in series with the display element;

a capacitor having one terminal connected to the control terminal of the drive transistor to hold a potential at the control terminal of the drive transistor;

a write control transistor having a control terminal connected to one of the i second scanning signal lines; a first conductive terminal connected to one of the j data signal lines; and a second conductive terminal connected to the first conductive terminal of the drive transistor; and a threshold voltage compensation transistor having a control terminal connected to one of the i first scanning signal lines; a first conductive terminal connected to the second conductive terminal of the drive transistor; and a second conductive terminal connected to the control terminal of the drive transistor, the threshold voltage compensation transistor is a thin-film transistor having a channel layer formed using an oxide semiconductor, the write control transistor is a thin-film transistor having a channel layer formed using low temperature polysilicon, and in the pixel circuit, a period during which a second scanning signal applied to a second scanning signal line connected to the control terminal of the write control transistor is maintained at on level is included in a period during which a first scanning signal applied to a first scanning signal line connected to the control terminal of the threshold voltage compensation transistor is maintained at on level.

A drive method (for a display device) according to some embodiments of the present disclosure is a drive method for a display device including a pixel circuit including a display element driven by a current, wherein the display device includes:

a pixel matrix of i rows×j columns including i×j pixel circuits, with i and j being an integer greater than or equal to 2;

i first scanning signal lines;

i second scanning signal lines; and j data signal lines, the pixel circuit includes:

the display element;

a drive transistor having a control terminal, a first conductive terminal, and a second conductive terminal, and provided in series with the display element;

a capacitor having one terminal connected to the control terminal of the drive transistor to hold a potential at the control terminal of the drive transistor;

a write control transistor having a control terminal connected to one of the i second scanning signal lines; a first conductive terminal connected to one of the j data signal lines; and a second conductive terminal connected to the first conductive terminal of the drive transistor; and a threshold voltage compensation transistor having a control terminal connected to one of the i first scanning signal lines; a first conductive terminal connected to the second conductive terminal of the drive transistor; and a second conductive terminal connected to the control terminal of the drive transistor, the threshold voltage compensation transistor is a thin-film transistor having a channel layer formed using an oxide semiconductor, the write control transistor is a thin-film transistor having a channel layer formed using low temperature polysilicon, the drive method includes:

a first scanning signal line driving step of driving the i first scanning signal lines such that the threshold voltage compensation transistor in the pixel circuit goes into on state row by row sequentially; and a second scanning signal line driving step of driving the i second scanning signal lines such that the write control transistor in the pixel circuit goes into on state row by row sequentially, and for the pixel circuit in each row, a period during which the write control transistor is maintained in on state by the second scanning signal line driving step is included in a period during which the threshold voltage compensation transistor is maintained in on state by the first scanning signal line driving step.

A display device according to some other embodiments of the present disclosure is a display device including a pixel circuit including a N-type transistor and a P-type transistor, the display device including:

a pixel matrix of i rows×j columns including i×j pixel circuits, with i and j being an integer greater than or equal to 2;

i first scanning signal lines configured to drive the N-type transistor;

i second scanning signal lines configured to drive the P-type transistor;

a scanning signal line drive circuit configured to apply a first scanning signal to the i first scanning signal lines, and apply a second scanning signal to the i second scanning signal lines, the scanning signal line drive circuit including a shift register that includes i unit circuits and that is configured to operate based on a first clock signal and a second clock signal;

a first constant potential line configured to supply a first constant potential; and a second constant potential line configured to supply a second constant potential higher than the first constant potential, wherein each of the unit circuits includes a first internal node; a second internal node to which a potential having a same logic level as the first internal node is provided; a first control circuit configured to control a potential at the first internal node; a first output circuit configured to apply the first scanning signal to a corresponding one of the first scanning signal lines; and a second output circuit configured to apply the second scanning signal to a corresponding one of the second scanning signal lines, to an even-numbered unit circuit there are inputted the first clock signal as a first control clock and inputted the second clock signal as a second control clock, to an odd-numbered unit circuit there are inputted the second clock signal as the first control clock and inputted the first clock signal as the second control clock, the first control circuit includes:
an input terminal configured to receive the first control clock; and
an output node connected to the first internal node, the first output circuit includes:
a first output terminal connected to the corresponding one of the first scanning signal lines;
a first scanning signal turn-on transistor of P-type configured to bring the first scanning signal applied to the first scanning signal line connected to the first output terminal to on level, the first scanning signal turn-on transistor having a control terminal connected to the first internal node; and
a first scanning signal turn-off transistor of N-type having a control terminal connected to the first internal node; a first conductive terminal connected to the first output terminal; and a second conductive terminal connected to the first constant potential line, and the second output circuit includes:
a second output terminal connected to another unit circuit and the corresponding one of the second scanning signal lines;
a second scanning signal control transistor of P-type having a control terminal connected to the second internal node; a first conductive terminal to which the second control clock is provided; and a second conductive terminal connected to the second output terminal; and
a capacitor having a first terminal connected to the second internal node; and a second terminal connected to the second output terminal.

A drive method (for a display device) according to some other embodiments of the present disclosure is a drive method for a display device including a pixel circuit including a N-type transistor and a P-type transistor, wherein
the display device includes:
a pixel matrix of i rows×j columns including i×j pixel circuits, with i and j being an integer greater than or equal to 2;
i first scanning signal lines configured to drive the N-type transistor;
i second scanning signal lines configured to drive the P-type transistor;
a scanning signal line drive circuit configured to apply a first scanning signal to the i first scanning signal lines, and apply a second scanning signal to the i second scanning signal lines, the scanning signal line drive circuit including a shift register that includes i unit circuits and that is configured to operate based on a first clock signal and a second clock signal;
a first constant potential line configured to supply a first constant potential; and
a second constant potential line configured to supply a second constant potential higher than the first constant potential, each of the unit circuits includes a first internal node; a second internal node to which a potential having a same logic level as the first internal node is provided; a first control circuit configured to control a potential at the first internal node; a first output circuit configured to apply the first scanning signal to a corresponding one of the first scanning signal lines; and a second output circuit configured to apply the second scanning signal to a corresponding one of the second scanning signal lines, the first clock signal and the second clock signal are two-phase clock signals that periodically repeat a first period during which a potential having a first level is maintained and a second period during which a potential having a second level higher than the first level is maintained, to an odd-numbered unit circuit there are inputted the first clock signal as a first control clock and inputted the second clock signal as a second control clock, to an even-numbered unit circuit there are inputted the second clock signal as the first control clock and inputted the first clock signal as the second control clock, the first control circuit includes:
an input terminal configured to receive the first control clock; and
an output node connected to the first internal node, the first output circuit includes:
a first output terminal connected to the corresponding one of the first scanning signal lines;
a first scanning signal turn-on transistor of P-type configured to bring the first scanning signal applied to the first scanning signal line connected to the first output terminal to on level, the first scanning signal turn-on transistor having a control terminal connected to the first internal node; and
a first scanning signal turn-off transistor of N-type having a control terminal connected to the first internal node; a first conductive terminal connected to the first output terminal; and a second conductive terminal connected to the first constant potential line, the second output circuit includes:
a second output terminal connected to another unit circuit and the corresponding one of the second scanning signal lines;
a second scanning signal control transistor of P-type having a control terminal connected to the second internal node; a first conductive terminal to which the second control clock is provided; and a second conductive terminal connected to the second output terminal; and
a capacitor having a first terminal connected to the second internal node; and a second terminal connected to the second output terminal, for each of the unit circuits, the drive method includes:
a first step of changing the first control clock from the second level to the first level so that the potential at the first internal node changes from high level to low level;
a second step of changing the second control clock from the second level to the first level during a period during which the potential at the first internal node is maintained at low level, so that the second scanning signal outputted from the second output circuit changes from off level to on level;
a third step of changing the second control clock from the first level to the second level after a lapse of a predetermined period from when the second step is performed, so that the second scanning signal outputted from the second output circuit changes from on level to off level; and
a fourth step of changing the first control clock from the second level to the first level after a lapse of a predetermined period from when the third step is performed, so that the first scanning signal outputted from the first output circuit changes from on level to off level, and the first scanning signal outputted from the first output circuit changes from off level to on level during a period after a time point at which the first step is performed and before a time point immediately before the second step is performed.

A display device according to some still other embodiments of the present disclosure is a display device including a plurality of pixel circuits each including a display element driven by a current, the display device including:

a pixel matrix of i rows×j columns including i×j pixel circuits, with i and j being an integer greater than or equal to 2;

i first scanning signal lines;

i second scanning signal lines;

i light emission control lines;

j data signal lines;

a plurality of initialization power lines configured to supply an initialization voltage;

a first power line configured to supply a low-level power supply voltage; and a second power line configured to supply a high-level power supply voltage, wherein each of the plurality of pixel circuits includes:

the display element having a first terminal; and a second terminal connected to the first power line;

a drive transistor having a control terminal, a first conductive terminal, and a second conductive terminal, and provided in series with the display element;

a capacitor having one terminal connected to the control terminal of the drive transistor, and another terminal connected to the second power line;

a write control transistor having a control terminal connected to one of the i second scanning signal lines; a first conductive terminal connected to one of the j data signal lines; and a second conductive terminal connected to the first conductive terminal of the drive transistor;

a threshold voltage compensation transistor having a control terminal connected to one of the i first scanning signal lines; a first conductive terminal connected to the second conductive terminal of the drive transistor; and a second conductive terminal connected to the control terminal of the drive transistor, a power supply control transistor having a control terminal connected to one of the i light emission control lines; a first conductive terminal connected to the second power line; and a second conductive terminal connected to the first conductive terminal of the drive transistor;

a light emission control transistor having a control terminal connected to one of the i light emission control lines; a first conductive terminal connected to the second conductive terminal of the drive transistor; and a second conductive terminal connected to the first terminal of the display element;

a first initialization transistor having a control terminal connected to one of the i first scanning signal lines; a first conductive terminal connected to the control terminal of the drive transistor; and a second conductive terminal connected to one of the plurality of initialization power lines; and a second initialization transistor having a control terminal connected to the control terminal of the first initialization transistor in a pixel circuit in a subsequent row; a first conductive terminal connected to the first terminal of the display element; and a second conductive terminal connected to the first conductive terminal of the first initialization transistor in the pixel circuit in the subsequent row, and the first initialization transistor and the second initialization transistor each are a thin-film transistor having a channel layer formed using an oxide semiconductor.

Effects of the Invention

According to some embodiments of the present disclosure, in each pixel circuit, a period during which the write control transistor is maintained in on state is included in a period during which the threshold voltage compensation transistor is maintained in on state. Here, the threshold voltage compensation transistor is an IGZO-TFT and the write control transistor is an LTPS-TFT. The LTPS-TFT has high mobility and enables high speed writing, and thus, if the write control transistor is on state during a period which is a part of a period during which the threshold voltage compensation transistor is maintained in on state, then writing based on a data signal is sufficiently performed. Thus, a display device (e.g., an organic EL display device) that includes pixel circuits, in each of which an IGZO-TFT and an LTPS-TFT coexist, and that operates normally is implemented.

According to some other embodiments of the present disclosure, a unit circuit included in the shift register in the scanning signal line drive circuit includes a first output circuit that applies a first scanning signal to a first scanning signal line for driving an N-type transistor in a pixel circuit; and a second output circuit that applies a second scanning signal to a second scanning signal line for driving a P-type transistor in the pixel circuit. The first output circuit includes a first scanning signal turn-on transistor which is a P-type transistor, and a first scanning signal turn-off transistor which is an N-type transistor, and rising of the first scanning signal is performed through the first scanning signal turn-on transistor, and falling of the first scanning signal is performed through the first scanning signal turn-off transistor. Hence, a difference between a potential in a rise state of the first scanning signal and a potential in a fall state of the first scanning signal is sufficiently large, and thus, the on and off of the N-type transistor in the pixel circuit are securely performed. In addition, the second output circuit includes a second scanning signal control transistor which is a P-type transistor; and a capacitor that functions as a boost capacitance, and the falling and rising of the second scanning signal are performed through the capacitor. Hence, a difference between a potential in a fall state of the second scanning signal and a potential in a rise state of the second scanning signal is sufficiently large, and thus, the on and off of the P-type transistor in the pixel circuit are securely performed. Thus, it becomes possible to implement a display device (e.g., an organic EL display device) that includes pixel circuits, in each of which an N-type transistor and a P-type transistor coexist, and that operates normally, while suppressing an increase in processing cost.

According to some still other embodiments of the present disclosure, a second initialization transistor in a pixel circuit in a given row is connected in series with a first initialization transistor in a pixel circuit in a row subsequent to the given row. Hence, a transistor that is directly connected to an initialization power line is only the first initialization transistor. By this, a load on the initialization power line decreases, enabling supply of a stable potential with high noise immunity to the pixel circuits.

MODES FOR CARRYING OUT THE INVENTION

Embodiments will be described below with reference to the accompanying drawings. For second to eighth embodiments, differences from a first embodiment will be mainly described, and description of the same configurations as those of the first embodiment is omitted as appropriate. Note that in the following description, it is assumed that i and j are integers greater than or equal to 2, n is an integer between 1 and i, inclusive, and m is an integer between 1 and j, inclusive.

1. First Embodiment

<1.1 Overall Configuration>

Figure 2:
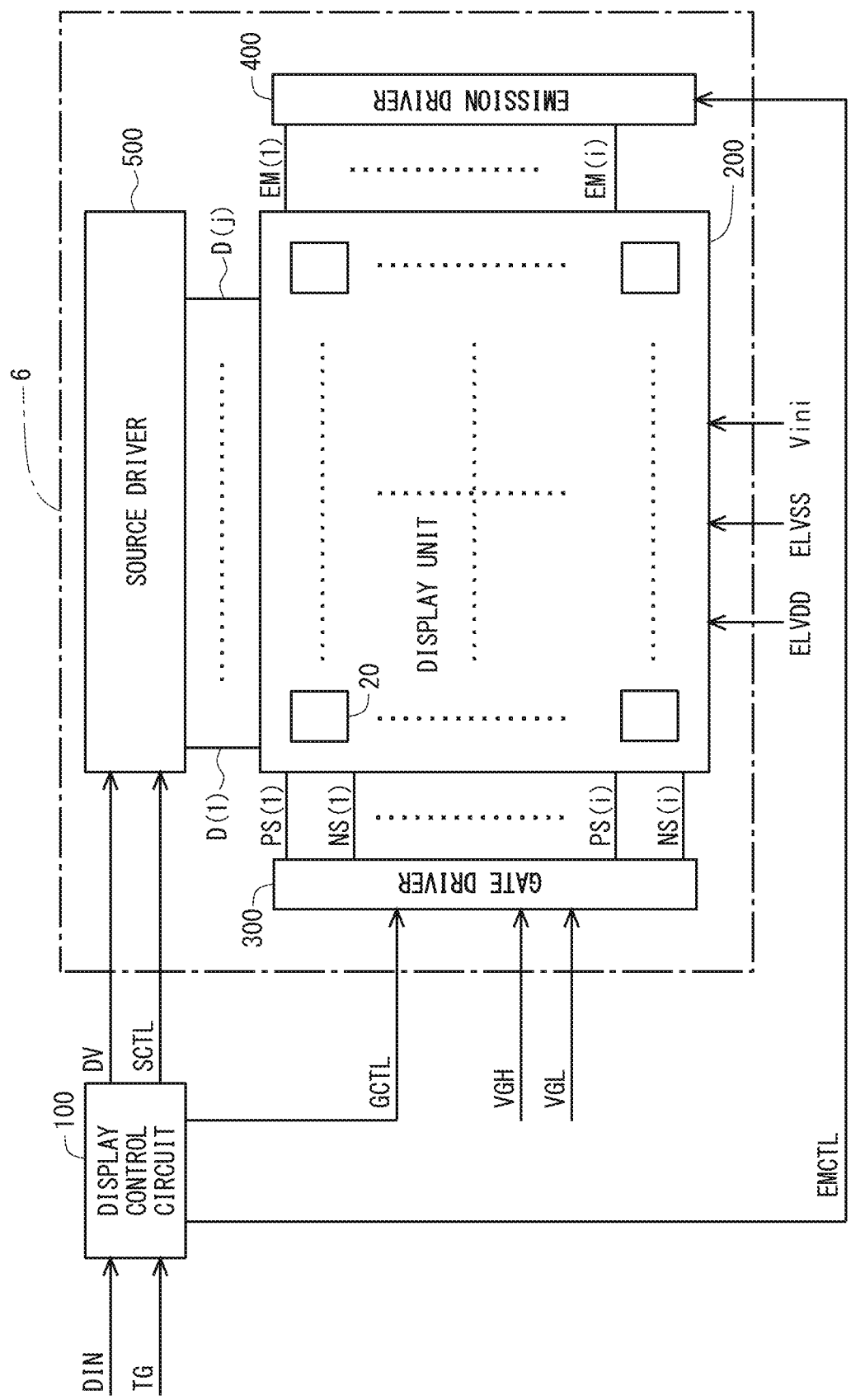
FIG. 2 is a block diagram showing an overall configuration of an organic EL display device according to the first embodiment.

FIG. 2 is a block diagram showing an overall configuration of an organic EL display device according to the first embodiment. As shown in FIG. 2, the organic EL display device includes a display control circuit 100, a display unit 200, a gate driver (scanning signal line drive circuit) 300, an emission driver (light emission control line drive circuit) 400, and a source driver (data signal line drive circuit) 500. The gate driver 300, the emission driver 400, and the source driver 500 are included in an organic EL display panel 6 including the display unit 200. In the present embodiment, the gate driver 300 and the emission driver 400 are monolithically formed. The source driver 500 may be monolithically formed or may not be monolithically formed.

In the display unit 200 there are disposed i first scanning signal lines NS(1) to NS(i), i second scanning signal lines PS(1) to PS(i), i light emission control lines EM(1) to EM(i), and j data signal lines D(1) to D(j). Note that depiction of those lines in the display unit 200 in FIG. 2 is omitted. The first scanning signal lines NS(1) to NS(i) are signal lines for transmitting first scanning signals which are the above-described N-type control signals, and the second scanning signal lines PS(1) to PS(i) are signal lines for transmitting second scanning signals which are the above-described P-type control signals. Note that a configuration of a pixel circuit will be described later. The first scanning signal lines NS(1) to NS(i), the second scanning signal lines PS(1) to PS(i), and the light emission control lines EM(1) to EM(i) are typically parallel to each other. The first scanning signal lines NS(1) to NS(i) and the data signal lines D(1) to D(j) are orthogonal to each other. In the following description, if necessary, first scanning signals which are provided to the respective first scanning signal lines NS(1) to NS(i) are also given reference characters NS(1) to NS(i), second scanning signals which are provided to the respective second scanning signal lines PS(1) to PS(i) are also given reference characters PS(1) to PS(i), light emission control signals which are provided to the respective light emission control lines EM(1) to EM(i) are also given reference characters EM(1) to EM(i), and data signals which are provided to the respective data signal lines D(1) to D(j) are also given reference characters D(1) to D(j).

In addition, in the display unit 200 there are provided i×j pixel circuits 20 at intersecting portions of the i first scanning signal lines NS(1) to NS(i) and the j data signal lines D(1) to D(j). By thus providing the i×j pixel circuits 20, a pixel matrix of i rows×j columns is formed in the display unit 200. Furthermore, in the display unit 200 there are disposed power lines (not shown) provided to be shared between the pixel circuits 20. More specifically, there are disposed a power line that supplies a low-level power supply voltage ELVSS for driving organic EL elements (hereinafter, referred to as "low-level power line".), a power line that supplies a high-level power supply voltage ELVDD for driving the organic EL elements (hereinafter, referred to as "high-level power line".), and a power line that supplies an initialization voltage Vini (hereinafter, referred to as "initialization power line".). The low-level power supply voltage ELVSS, the high-level power supply voltage ELVDD, and the initialization voltage Vini are supplied from a power supply circuit which is not shown. Note that the low-level power line corresponds to a first power line and the high-level power line corresponds to a second power line.

Operation of each component shown in FIG. 2 will be described below. The display control circuit 100 receives an input image signal DIN and a timing signal group (a horizontal synchronizing signal, a vertical synchronizing signal, etc.) TG which are transmitted from an external source, and outputs digital video signals DV, gate control signals GCTL that control operation of the gate driver 300, emission driver control signals EMCTL that control operation of the emission driver 400, and source control signals SCTL that control operation of the source driver 500. The gate control signals GCTL include a gate start pulse signal, a gate clock signal, etc. The emission driver control signals EMCTL include an emission start pulse signal, an emission clock signal, etc. The source control signals SCTL include a source start pulse signal, a source clock signal, a latch strobe signal, etc.

The gate driver 300 is connected to the first scanning signal lines NS(1) to NS(i) and the second scanning signal lines PS(1) to PS(i). The gate driver 300 applies first scanning signals to the first scanning signal lines NS(1) to NS(i) and applies second scanning signals to the second scanning signal lines PS(1) to PS(i), based on the gate control signals GCTL outputted from the display control circuit 100. A high-level potential applied to the first scanning signal lines NS(1) to NS(i) is equal to a high-level potential applied to the second scanning signal lines PS(1) to PS(i), and a low-level potential applied to the first scanning signal lines NS(1) to NS(i) is equal to a low-level potential applied to the second scanning signal lines PS(1) to PS(i).

The emission driver 400 is connected to the light emission control lines EM(1) to EM(i). The emission driver 400 applies light emission control signals to the light emission control lines EM(1) to EM(i), based on the emission driver control signals EMCTL outputted from the display control circuit 100.

The source driver 500 includes a j-bit shift register, a sampling circuit, a latch circuit, j D/A converters, etc., which are not shown. The shift register has j cascade-connected registers. The shift register sequentially transfers a pulse of the source start pulse signal supplied to a register at an initial stage, from an input terminal to an output terminal, based on the source clock signal. According to the transfer of the pulse, a sampling pulse is outputted from each stage of the shift register. Based on the sampling pulse, the sampling circuit stores a digital video signal DV. The latch circuit captures and holds digital video signals DV for one row which are stored in the sampling circuit, in accordance with the latch strobe signal. The D/A converters are provided so as to correspond to the respective data signal lines D(1) to D(j). The D/A converters convert the digital video signals DV held in the latch circuit into analog voltages. The converted analog voltages are simultaneously applied, as data signals, to all data signal lines D(1) to D(j).

In the above-described manner, the data signals are applied to the data signal lines D(1) to D(j), the first scanning signals are applied to the first scanning signal lines NS(1) to NS(i), the second scanning signals are applied to the second scanning signal lines PS(1) to PS(i), and the light emission control signals are applied to the light emission control lines EM(1) to EM(i), by which an image based on the input image signal DIN is displayed on the display unit 200.

<1.2 Configuration of a Pixel Circuit>

Figure 3:
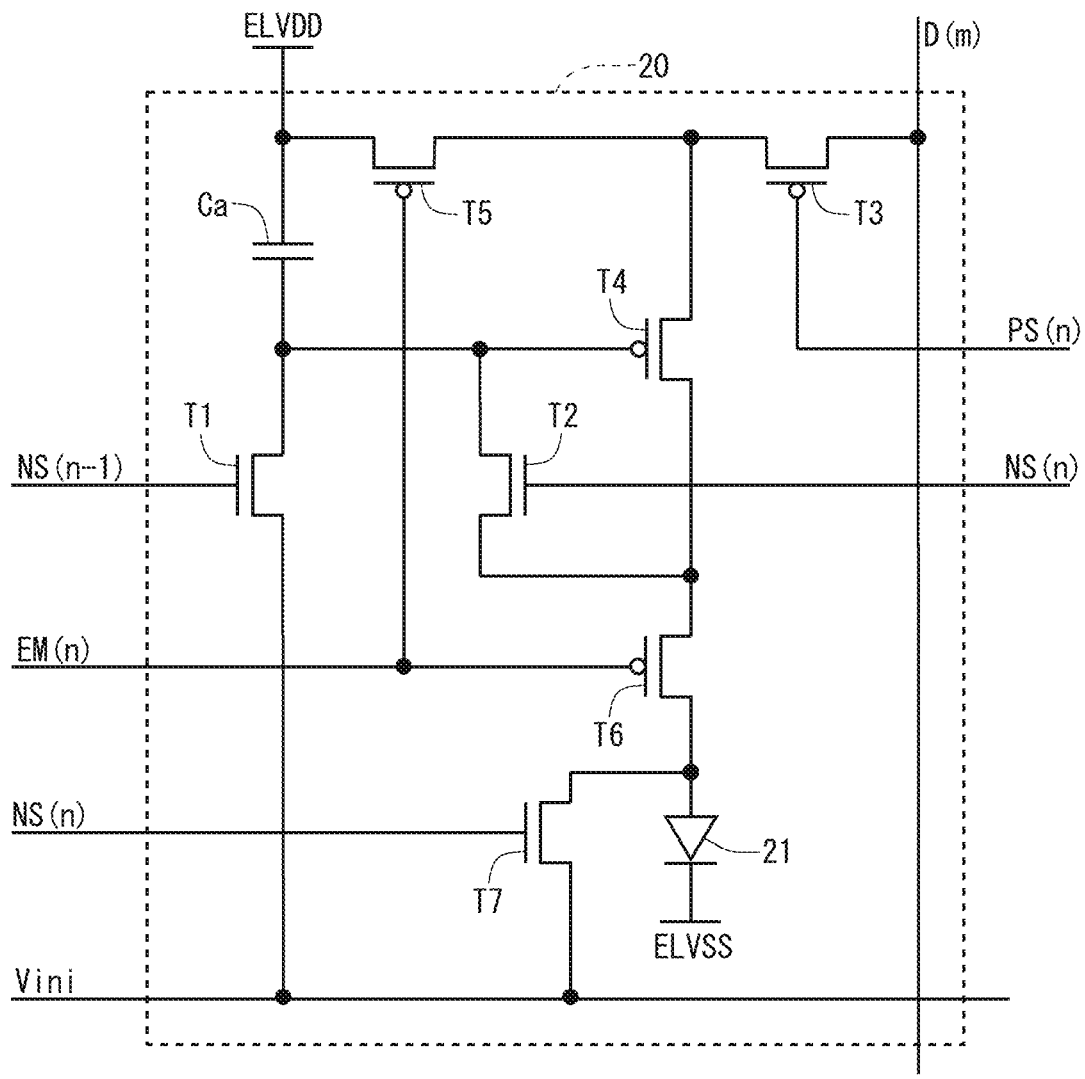
FIG. 3 is a circuit diagram showing a configuration of a pixel circuit in an nth row and an mth column in the first embodiment.

Next, a configuration of a pixel circuit 20 in the display unit 200 will be described. Note that the configuration of the pixel circuit 20 shown here is an example and thus is not limited thereto. FIG. 3 is a circuit diagram showing a configuration of a pixel circuit 20 in an nth row and an mth column. The pixel circuit 20 shown in FIG. 3 includes one organic EL element (organic light-emitting diode) 21 which serves as a display element; seven transistors (typically, thin-film transistors) T1 to T7 (a first initialization transistor T1, a threshold voltage compensation transistor T2, a write control transistor T3, a drive transistor T4, a power supply control transistor T5, a light emission control transistor T6, and a second initialization transistor T7); and one holding capacitor Ca. The transistors T1, T2, and T7 are N-type transistors. The transistors T3 to T6 are P-type transistors. In terms of a material of a channel layer, the transistors T1, T2, and T7 are, for example, IGZO-TFTs, and the transistors T3 to T6 are, for example, LTPS-TFTs. Note, however, that the configuration is not limited thereto. The holding capacitor Ca is a capacitive element including two electrodes (a first electrode and a second electrode).

The first initialization transistor T1 is connected at its control terminal to a first scanning signal line NS (n−1) in an (n−1)th row, connected at its first conductive terminal to a second conductive terminal of the threshold voltage compensation transistor T2, a control terminal of the drive transistor T4, and the second electrode of the holding capacitor Ca, and connected at its second conductive terminal to an initialization power line. The threshold voltage compensation transistor T2 is connected at its control terminal to a first scanning signal line NS(n) in the nth row, connected at its first conductive terminal to a second conductive terminal of the drive transistor T4 and a first conductive terminal of the light emission control transistor T6, and connected at its second conductive terminal to the first conductive terminal of the first initialization transistor T1, the control terminal of the drive transistor T4, and the second electrode of the holding capacitor Ca. The write control transistor T3 is connected at its control terminal to a second scanning signal line PS(n) in the nth row, connected at its first conductive terminal to a data signal line D(m) in the mth column, and connected at its second conductive terminal to a first conductive terminal of the drive transistor T4 and a second conductive terminal of the power supply control transistor T5. The drive transistor T4 is connected at its control terminal to the first conductive terminal of the first initialization transistor T1, the second conductive terminal of the threshold voltage compensation transistor T2, and the second electrode of the holding capacitor Ca, connected at its first conductive terminal to the second conductive terminal of the write control transistor T3 and the second conductive terminal of the power supply control transistor T5, and connected at its second conductive terminal to the first conductive terminal of the threshold voltage compensation transistor T2 and the first conductive terminal of the light emission control transistor T6.

The power supply control transistor T5 is connected at its control terminal to a light emission control line EM(n) in the nth row, connected at its first conductive terminal to a high-level power line and the first electrode of the holding capacitor Ca, and connected at its second conductive terminal to the second conductive terminal of the write control transistor T3 and the first conductive terminal of the drive transistor T4. The light emission control transistor T6 is connected at its control terminal to the light emission control line EM(n) in the nth row, connected at its first conductive terminal to the first conductive terminal of the threshold voltage compensation transistor T2 and the second conductive terminal of the drive transistor 14, and connected at its second conductive terminal to a first conductive terminal of the second initialization transistor T7 and an anode terminal of the organic EL element 21. The second initialization transistor T7 is connected at its control terminal to the first scanning signal line NS(n) in the nth row, connected at its first conductive terminal to the second conductive terminal of the light emission control transistor T6 and the anode terminal of the organic EL element 21, and connected at its second conductive terminal to the initialization power line. The holding capacitor Ca is connected at its first electrode to the high-level power line and the first conductive terminal of the power supply control transistor T5, and connected at its second electrode to the first conductive terminal of the first initialization transistor T1, the second conductive terminal of the threshold voltage compensation transistor T2, and the control terminal of the drive transistor T4. The organic EL element 21 is connected at its anode terminal to the second conductive terminal of the light emission control transistor T6 and the first conductive terminal of the second initialization transistor T7, and connected at its cathode terminal to a low-level power line.

As described above, in the pixel circuit 20 in the nth row and the mth column, the control terminal of the first initialization transistor T1 is connected to the first scanning signal line NS(n−1) in the (n−1)th row, and the control terminal of the threshold voltage compensation transistor T2 is connected to the first scanning signal line NS(n) in the nth row. Thus, in the present embodiment, the control terminal of the first initialization transistor T1 in the pixel circuit 20 in the nth row and the control terminal of the threshold voltage compensation transistor T2 in the pixel circuit 20 in the (n−1)th row are connected to the same first scanning signal line NS(n−1) among the i first scanning signal lines NS(1) to NS(i). Note, however, that there is also a possible case in which a first scanning signal line that transmits a first scanning signal which is provided to the control terminal of the first initialization transistor T1 in the pixel circuit 20 in the nth row and a first scanning signal line that transmits a first scanning signal which is provided to the control terminal of the threshold voltage compensation transistor T2 in the pixel circuit 20 in the (n−1)th row are two signal lines that are branched off from one output of the gate driver 300. Considering also such a case, the following can be defined. A first scanning signal line connected to the control terminal of the first initialization transistor T1 in the pixel circuit 20 in the nth row and a first scanning signal line connected to the control terminal of the threshold voltage compensation transistor T2 in the pixel circuit 20 in the (n−1)th row use the same drive signal (first scanning signal).

<1.3 Gate Driver>
<1.3.1 Shift Register>

Figure 4:
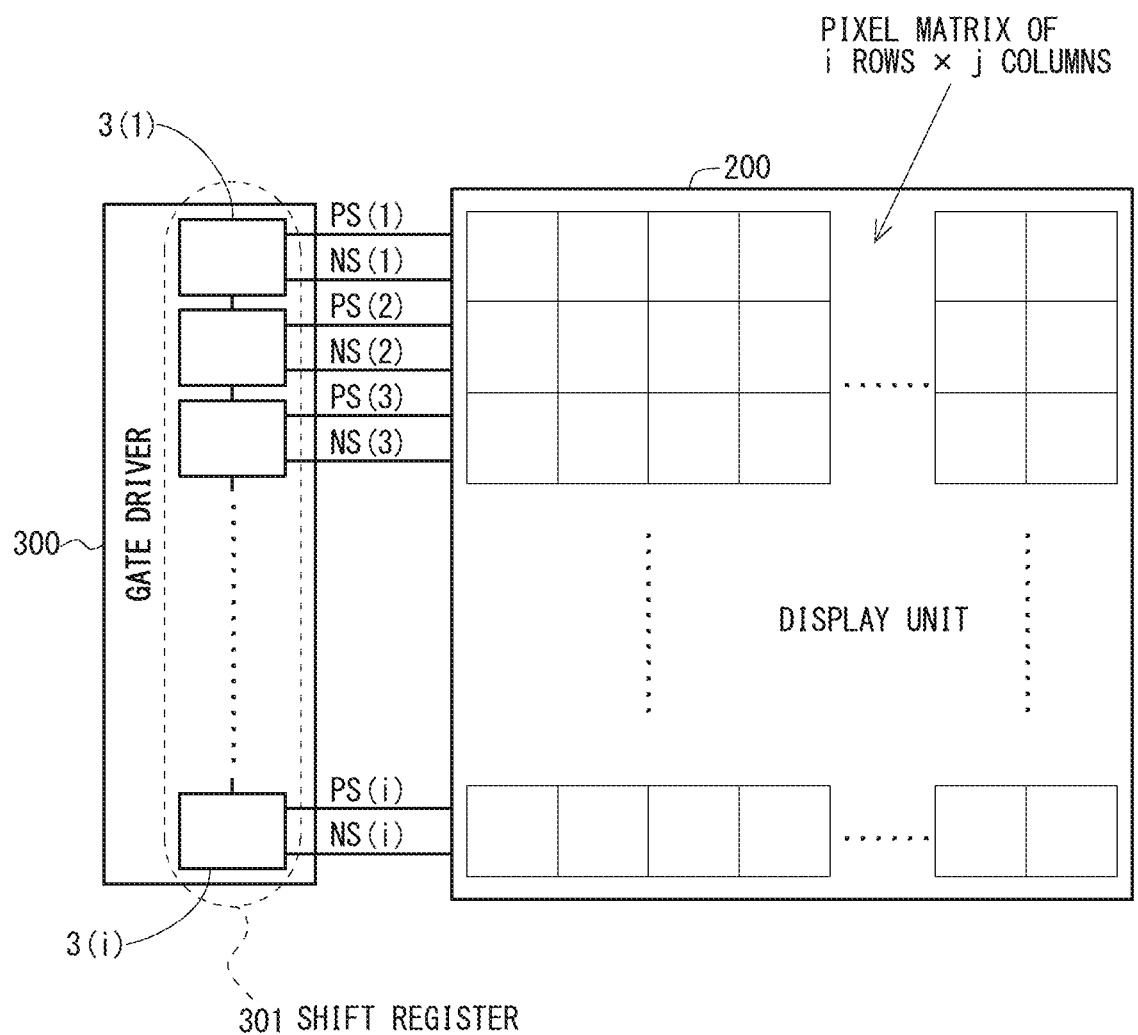
FIG. 4 is a diagram for describing a schematic configuration of the gate driver in the first embodiment.

FIG. 4 is a diagram for describing a schematic configuration of the gate driver 300. The gate driver 300 includes a shift register 301 including a plurality of stages. In the display unit 200 there is formed a pixel matrix of i rows×j columns, and the stages of the shift register 301 are provided in one-to-one correspondence with the rows of the pixel matrix. Note that in the following description, a circuit that forms each stage of the shift register 301 is referred to as "unit circuit". In the present embodiment, the shift register 301 includes i unit circuits 3(1) to 3(i).

Figure 5:
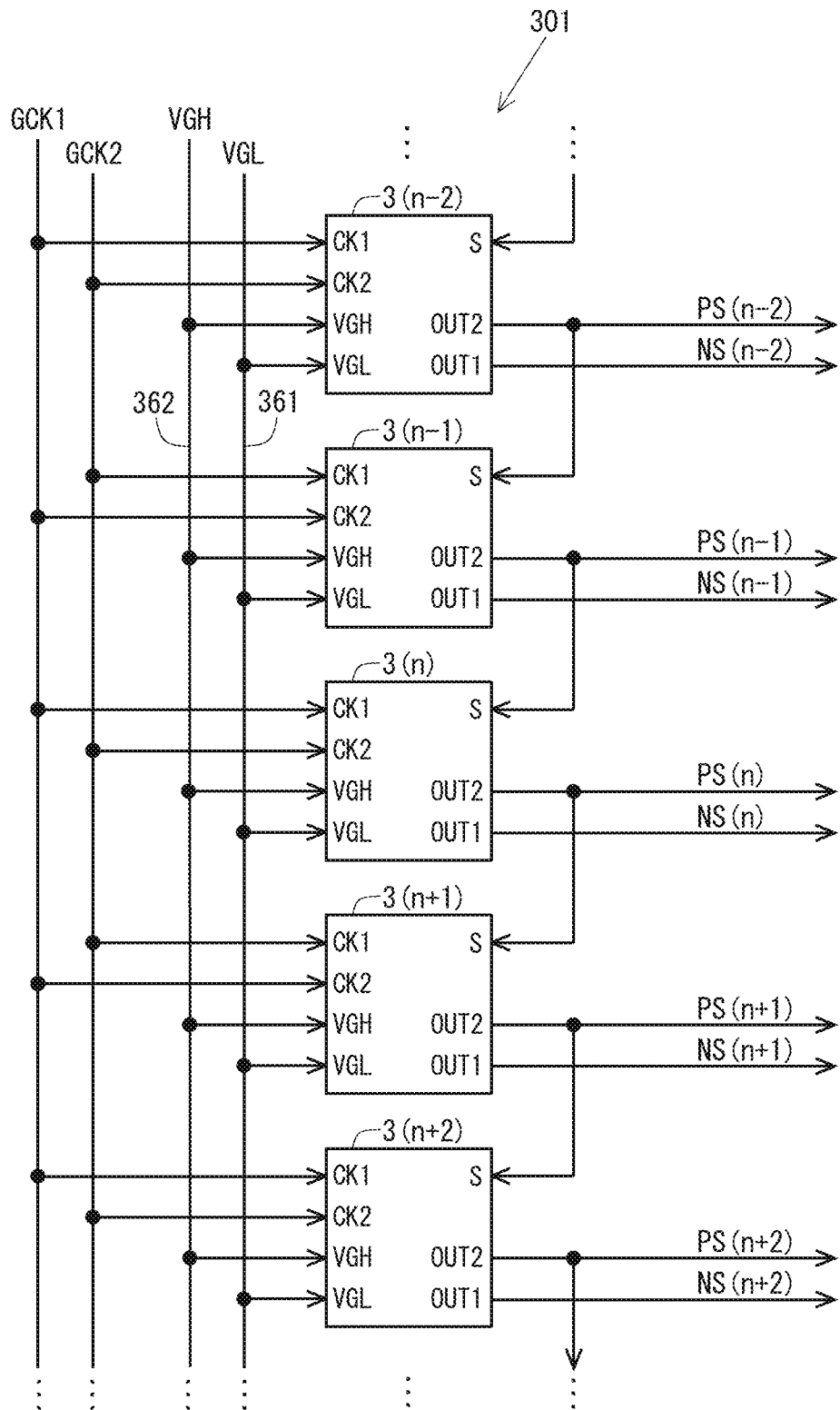
FIG. 5 is a block diagram showing a configuration of a portion of a shift register for five stages that is included in the gate driver in the first embodiment.

FIG. 5 is a block diagram showing a configuration of a portion of the shift register 301 for five stages. Here, assuming that n is an even number, attention is focused on unit circuits 3(n−2), 3(n−1), 3(n), 3(n+1), and 3(n+2) of an (n−2)th stage, an (n−1)th stage, an nth stage, an (n+1)th stage, and an (n+2)th stage. To the shift register 301 are provided, as gate control signals GCTL, a gate start pulse signal, a first gate clock signal GCK1, and a second gate clock signal GCK2. In addition, a gate low potential VGL serving as a first constant potential and a gate high potential VGH serving as a second constant potential are also provided to the shift register 301. The gate high potential VGH is a potential having a level that brings the N-type transistors in the pixel circuits 20 into on state and brings the P-type transistors in the pixel circuits 20 into off state. The gate low potential VGL is a potential having a level that brings the N-type transistors in the pixel circuits 20 into off state and brings the P-type transistors in the pixel circuits 20 into on state. Note that the gate low potential VGL is supplied by a first constant potential line 361, and the gate high potential VGH is supplied by a second constant potential line 362. The gate start pulse signal is a signal provided as a set signal S to the unit circuit 3(1) of the first stage and is omitted in FIG. 5.

Each unit circuit 3 includes input terminals for receiving a first control clock CK1, a second control clock CK2, a set signal S, a gate high potential VGH, and a gate low potential VGL, and output terminals for outputting an output signal OUT1 and an output signal OUT2. The output signal OUT1 is an N-type control signal and the output signal OUT2 is a P-type control signal. That is, each unit circuit 3 generates the N-type control signal and the P-type control signal.

For unit circuits 3 of even-numbered stages, the first gate clock signal GCK1 is provided as a first control clock CK1, and the second gate clock signal GCK2 is provided as a second control clock CK2. For unit circuits 3 of odd-numbered stages, the second gate clock signal GCK2 is provided as a first control clock CK1, and the first gate clock signal GCK1 is provided as a second control clock CK2. The gate high potential VGH and the gate low potential VGL are provided to all unit circuits 3 in a shared manner. In addition, to a unit circuit 3 of each stage is provided, as a set signal S, an output signal OUT2 from a unit circuit 3 of a previous stage. An output signal OUT1 from the unit circuit 3 of each stage is provided as a first scanning signal to a corresponding first scanning signal line NS. An output signal OUT2 from the unit circuit 3 of each stage is provided as a set signal S to a unit circuit 3 of a subsequent stage and is provided, as a second scanning signal, to a corresponding second scanning signal line PS. Note that as shown in FIG. 3, when taking a look at the pixel circuit 20 in the nth row, the first scanning signal line NS(n) is connected to the control terminal of the threshold voltage compensation transistor T2 and the control terminal of the second initialization transistor T7, the first scanning signal line NS(n−1) is connected to the control terminal of the first initialization transistor T1, and the second scanning signal line PS(n) is connected to the control terminal of the write control transistor T3.

Figure 6:
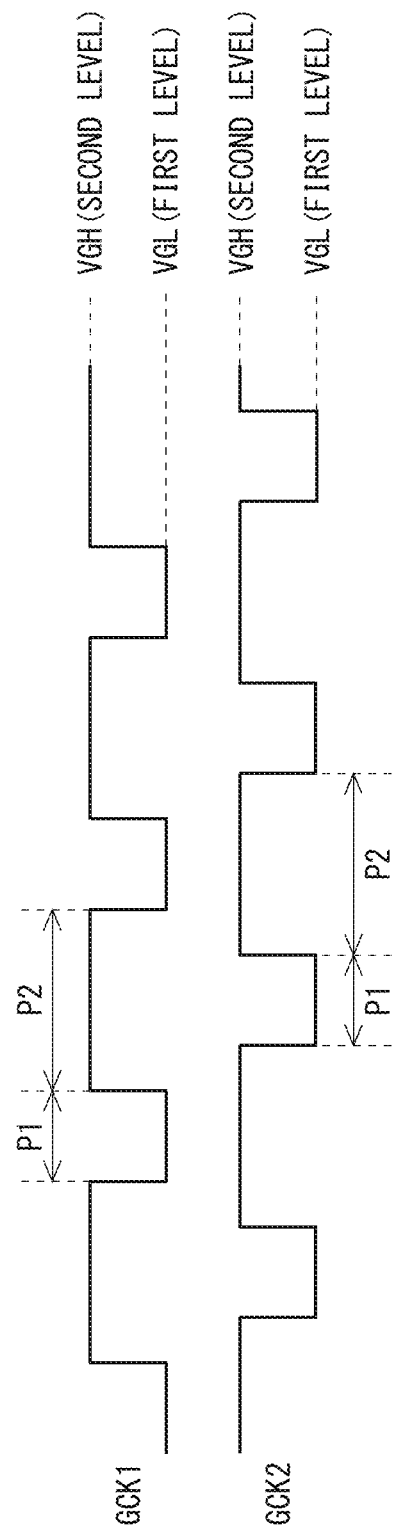
FIG. 6 is a diagram for describing gate clock signals in the first embodiment.

Meanwhile, as shown in FIG. 6, the first gate clock signal GCK1 and the second gate clock signal GCK2 are two-phase clock signals that periodically repeat a first period during which the gate low potential VGL (potential having a first level) is maintained and a second period during which the gate high potential VGH (potential having a second level) is maintained. A length P1 of the first period is less than or equal to a length P2 of the second period. Note, however, that typically, the length P1 of the first period is shorter than the length P2 of the second period. Note that the first gate clock signal GCK1 and the second gate clock signal GCK2 are outputted from a clock signal output circuit provided in the display control circuit 100.

<1.3.2 Unit Circuit>

Figure 1:
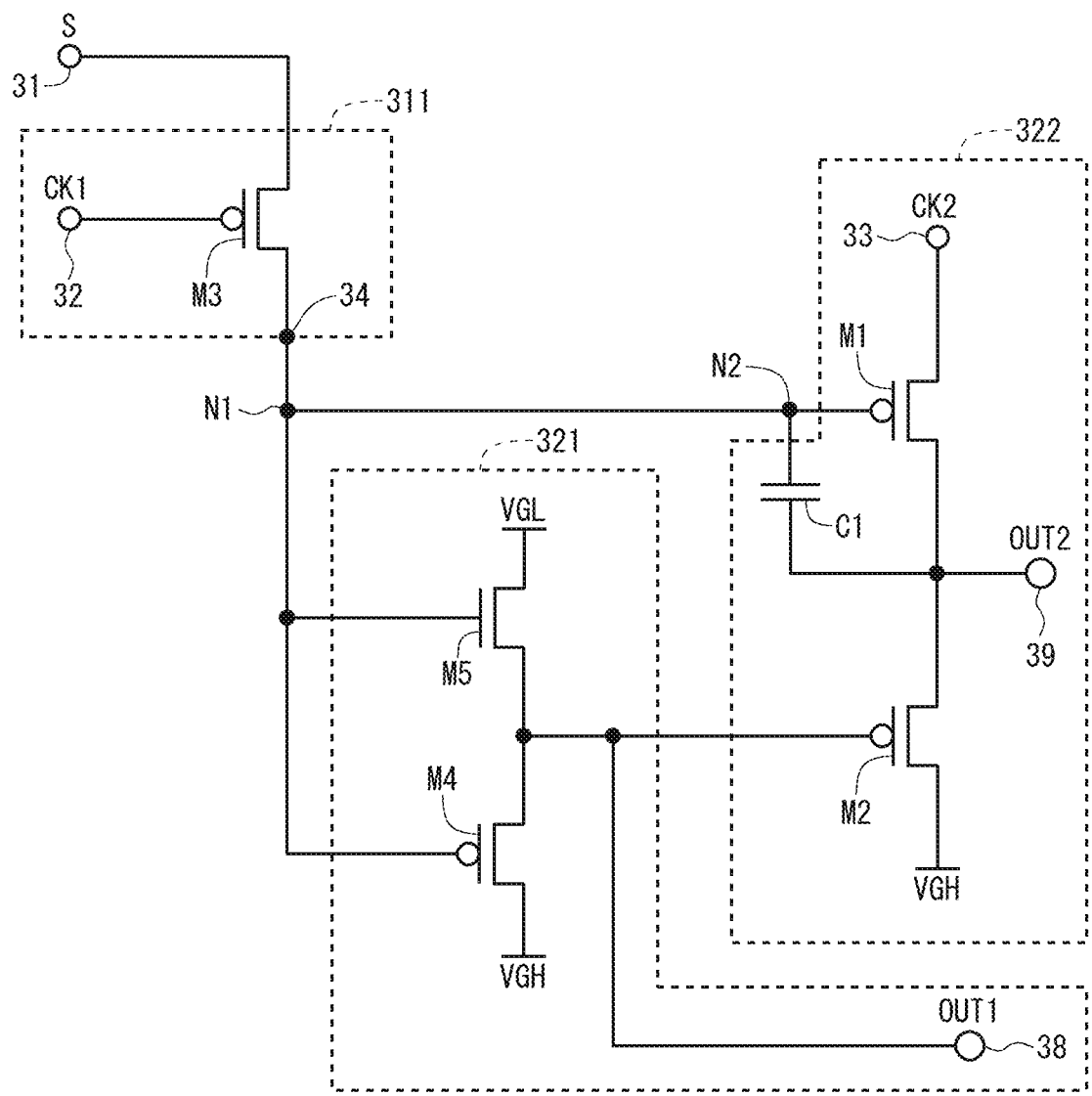
FIG. 1 is a circuit diagram showing a configuration of a unit circuit in a gate driver in a first embodiment.

FIG. 1 is a circuit diagram showing a configuration of a unit circuit 3 of the present embodiment. As shown in FIG. 1, the unit circuit 3 includes five transistors M1 to M5 and one capacitor C1. The transistors M1 to M4 are P-type transistors and the transistor M5 is an N-type transistor. The unit circuit 3 also has three input terminals 31 to 33 and two output terminals 38 and 39 in addition to an input terminal connected to a first constant potential line that supplies a gate low potential VGL, and an input terminal connected to a second constant potential line that supplies a gate high potential VGH. In FIG. 1, an input terminal for receiving a set signal S is given reference character 31, an input terminal for receiving a first control clock CK1 is given reference character 32, an input terminal for receiving a second control clock CK2 is given reference character 33, an output terminal for outputting an output signal OUT1 is given reference character 38, and an output terminal for outputting an output signal OUT2 is given reference character 39. Note that in the following description, the output terminal for outputting the output signal OUT1 is referred to as "first output terminal" and the output terminal for outputting the output signal OUT2 is referred to as "second output terminal".

A second conductive terminal of the transistor M3, a control terminal of the transistor M4, and a control terminal of the transistor M5 are connected to each other. Note that a node where they are connected to each other is referred to as "first internal node". The first internal node is given reference character N1. In addition, a control terminal of the transistor M1 and one terminal of the capacitor C1 are connected to each other. Note that a node where they are connected to each other is referred to as "second internal node". The second internal node is given reference character N2. Potentials having the same logic level are provided to the first internal node N1 and the second internal node N2. As can be grasped from FIG. 1, in the present embodiment, the first internal node N1 is directly connected to the second internal node N2.

Meanwhile, the unit circuit 3 includes a first control circuit 311 that controls the potential of the first internal node N1; a first output circuit 321 that controls output of the output signal OUT1; and a second output circuit 322 that controls output of the output signal OUT2. The first control circuit 311 includes the transistor M3. An output node 34 of the first control circuit 311 is connected to the first internal node N1. The first output circuit 321 includes the transistor M4 and the transistor M5. The second output circuit 322 includes the transistor M1, the transistor M2, and the capacitor C1.

The transistor M1 is connected at its control terminal to the second internal node N2, connected at its first conductive terminal to the input terminal 33, and connected at its second conductive terminal to the second output terminal 39. The transistor M2 is connected at its control terminal to the first output terminal 38, connected at its first conductive terminal to the second constant potential line, and connected at its second conductive terminal to the second output terminal 39. The transistor M3 is connected at its control terminal to the input terminal 32, connected at its first conductive terminal to the input terminal 31, and connected at its second conductive terminal to the first internal node N1. The transistor M4 is connected at its control terminal to the first internal node N1, connected at its first conductive terminal to the second constant potential line, and connected at its second conductive terminal to the first output terminal 38. The transistor M5 is connected at its control terminal to the first internal node N1, connected at its first conductive terminal to the first output terminal 38, and connected at its second conductive terminal to the first constant potential line. The capacitor C1 is connected at its one terminal to the second internal node N2 and connected at its another terminal to the second output terminal 39.

In the present embodiment, a second scanning signal control transistor is implemented by the transistor M1, a first internal node control transistor is implemented by the transistor M3, a first scanning signal turn-on transistor is implemented by the transistor M4, and a first scanning signal turn-off transistor is implemented by the transistor M5.

<1.4 Drive Method>

<1.4.1 Operation of the Unit Circuit>

Figure 7:
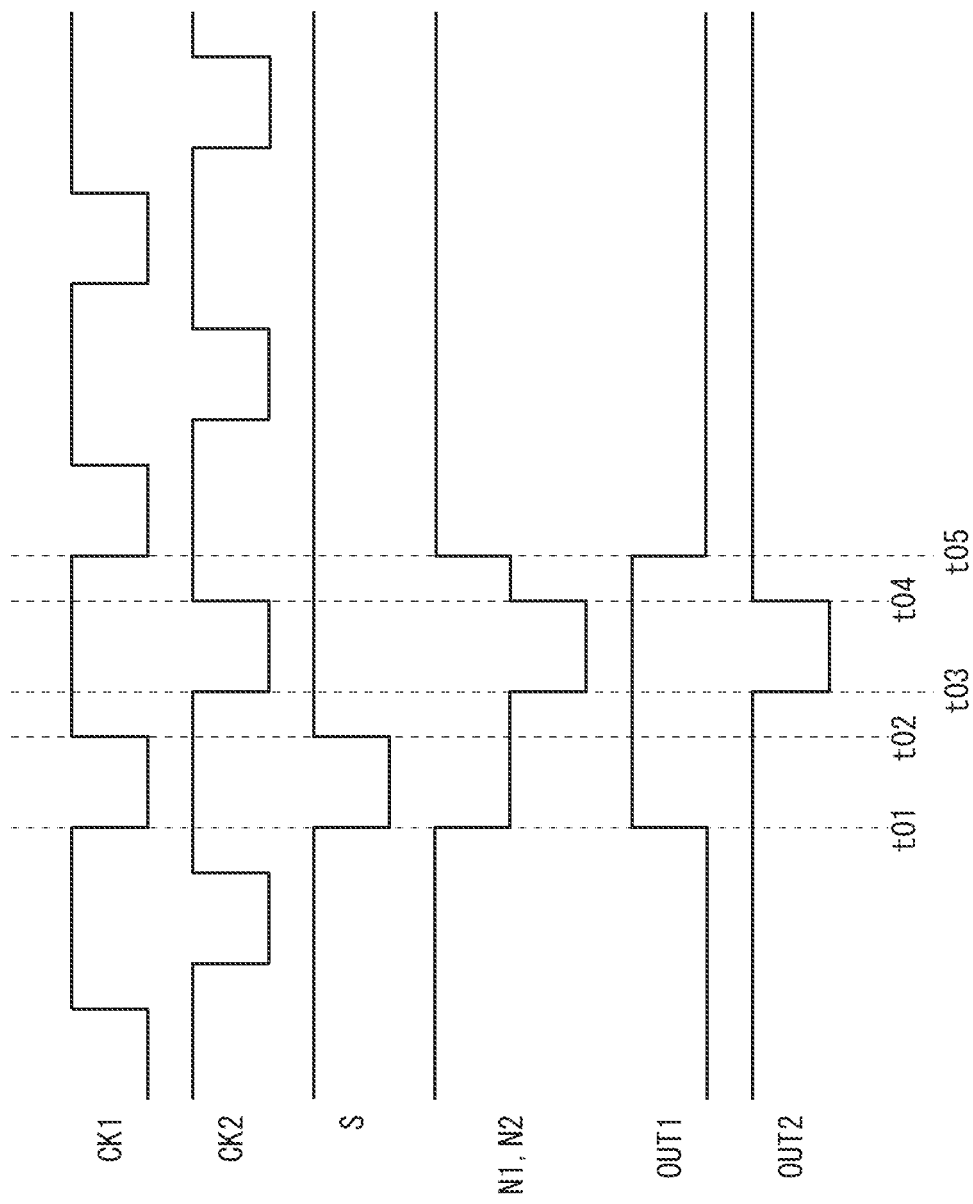
FIG. 7 is a timing chart for describing operation of the unit circuit in the first embodiment.

With reference to FIG. 7, operation of a unit circuit 3 will be described. During a period before time t01, the potentials at the first internal node N1 and the second internal node N2 are maintained at high level, the output signal OUT1 is maintained at low level, and the output signal OUT2 is maintained at high level. Note that since the output signal OUT1 is maintained at low level, the transistor M2 is maintained in on state.

At time t01, the first control clock CK1 changes from high level to low level. By this, the transistor M3 goes into on state. In addition, at time t01, the set signal S changes from high level to low level. By this, the potentials at the first internal node N1 and the second internal node N2 decrease to low level, and the transistor M1 and the transistor M4 go into on state and the transistor M5 goes into off state. By the transistor M4 going into on state and the transistor M5 going into off state, the output signal OUT1 changes from low level to high level. By this, the transistor M2 goes into off state.

At time t02, the first control clock CK1 changes from low level to high level. By this, the transistor M3 goes into off state. In addition, at time t02, the set signal S changes from low level to high level.

At time t03, the second control clock CK2 changes from high level to low level. At this time, since the transistor M1 is in on state, with a reduction in the potential at the input terminal 33, the potential at the second output terminal 39 (the potential of the output signal OUT2) decreases. Here, since the capacitor C1 is provided between the second internal node N2 and the second output terminal 39, with a reduction in the potential at the second output terminal 39, the potentials at the second internal node N2 and the first internal node N1 also decrease (the second internal node N2 and the first internal node N1 go into boost state). As a result of such boost operation, a large negative voltage is applied to the control terminal of the transistor M1, and the potential of the output signal OUT2 decreases to a level sufficient for a write control transistor T3 where the second output terminal 39 is connected to go into on state.

At time t04, the second control clock CK2 changes from low level to high level. By this, with an increase in the potential at the input terminal 33, the potential at the second output terminal 39 (the potential of the output signal OUT2) increases. When the potential at the second output terminal 39 increases, the potentials at the second internal node N2 and the first internal node N1 also increase through the capacitor C1.

At time t05, the first control clock CK1 changes from high level to low level. By this, the transistor M3 goes into on state. At this time, the set signal S is maintained at high level. Hence, the potentials at the first internal node N1 and the second internal node N2 increase to high level, and the transistor M1 and the transistor M4 go into off state and the transistor M5 goes into on state. By the transistor M4 going into off state and the transistor M5 going into on state, the output signal OUT1 changes from high level to low level. By this, the transistor M2 goes into on state.

During a period after time t05, as with the period before time t01, the potentials at the first internal node N1 and the second internal node N2 are maintained at high level, the output signal OUT1 is maintained at low level, and the output signal OUT2 is maintained at high level.

Figure 8:
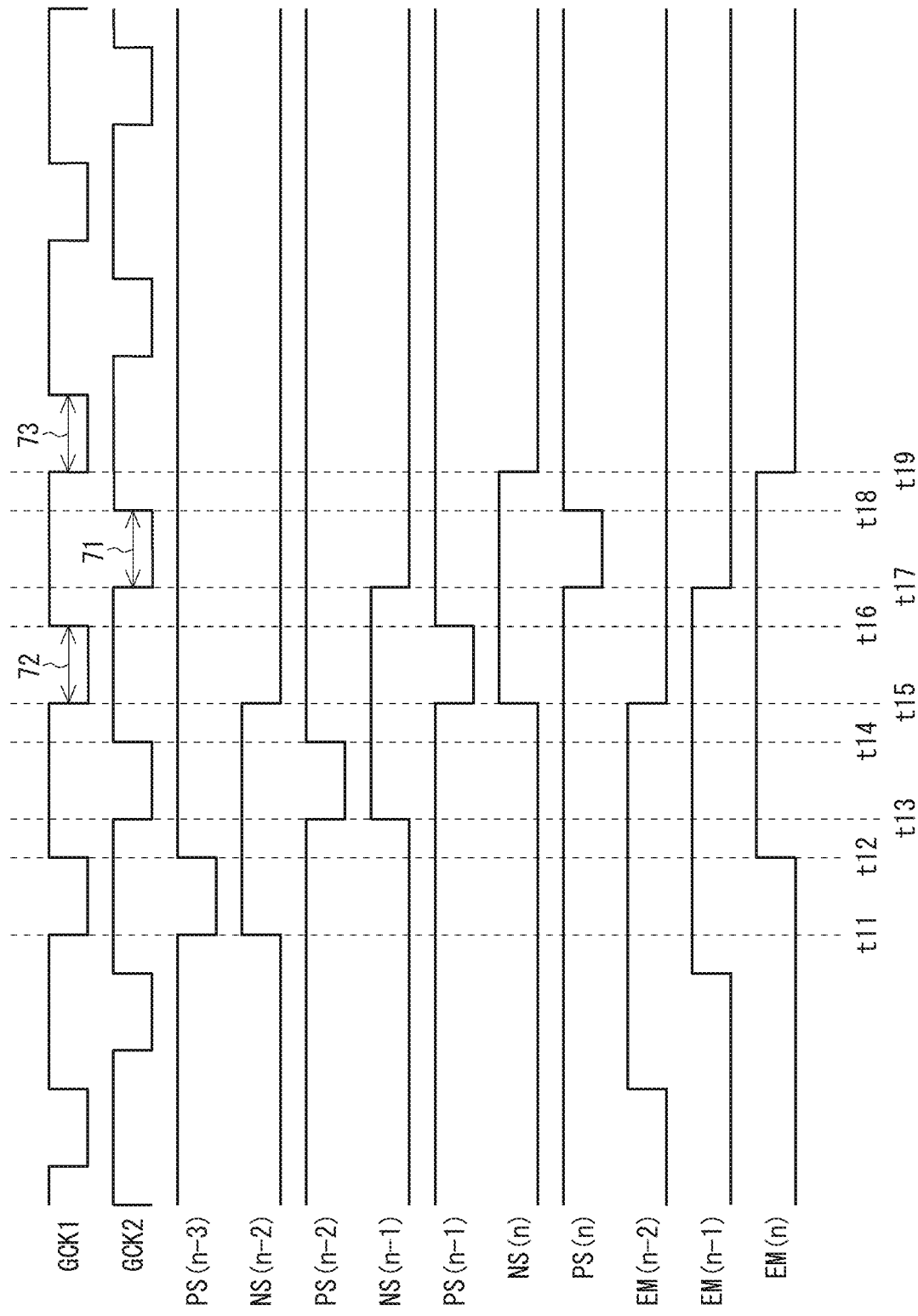
FIG. 8 is a timing chart showing waveforms of signals that control operation of pixel circuits from the (n−2)th to nth rows, etc., in the first embodiment.

By the unit circuits 3 operating in the above-described manner, waveforms of signals that control operation of pixel circuits 20 from the (n−2)th to nth rows, etc., are such as those shown in FIG. 8. Note that a second scanning signal PS(n−3) is provided as a set signal S to a unit circuit 3(n−2) of an (n−2)th stage. By the second scanning signal PS (n−3) changing from high level to low level at time t11, a first scanning signal NS(n−2) is maintained at high level during a period from time t11 to time t15, and a second scanning signal PS(n−2) is maintained at low level during a period from time t13 to time t14, based on the clock operation of a first gate clock signal GCK1 and a second gate clock signal GCK2. In addition, by the second scanning signal PS(n−2) changing from high level to low level at time t13, a first scanning signal NS(n−1) is maintained at high level during a period from time t13 to time t17, and a second scanning signal PS(n−1) is maintained at low level during a period from time t15 to time t16, based on the clock operation of the first gate clock signal GCK1 and the second gate clock signal GCK2. Furthermore, by the second scanning signal PS(n−1) changing from high level to low level at time t15, a first scanning signal NS(n) is maintained at high level during a period from time t15 to time t19, and a second scanning signal PS(n) is maintained at low level during a period from time t17 to time t18, based on the clock operation of the first gate clock signal GCK1 and the second gate clock signal GCK2. By the waveforms of the first scanning signals NS and the second scanning signals PS changing in the above-described manner, writing of data signals D to the pixel circuits 20 is sequentially performed row by row.

Meanwhile, when taking a look at a relationship between, for example, the (n−1)th row and the nth row, the length of a period from time t13 at which the first scanning signal NS(n−1) changes from low level to high level to time t15 at which the first scanning signal NS(n) changes from low level to high level is equal to the length of a period from time t15 at which the second scanning signal PS(n−1) changes from high level to low level to time t17 at which the second scanning signal PS(n) changes from high level to low level. That is, the length of a period from a time point at which the threshold voltage compensation transistor T2 in the pixel circuit 20 in the (n−1)th row changes from off state to on state to a time point at which the threshold voltage compensation transistor T2 in the pixel circuit 20 in the (n)th row changes from off state to on state is equal to the length of a period from a time point at which the write control transistor T3 in the pixel circuit 20 in the (n−1)th row changes from off state to on state to a time point at which the write control transistor T3 in the pixel circuit 20 in the (n)th row changes from off state to on state.

In addition, since the shift register 301 operates based on two-phase clock signals (the first gate clock signal GCK1 and the second gate clock signal GCK2), periods during which the second scanning signals PS are maintained at on level (low level) and periods during which the first scanning signals NS are maintained at on level (high level) are as follows. A period during which a second scanning signal PS(n) which is applied to a second scanning signal line connected to a second output terminal 39 of a unit circuit 3(n) of an nth stage is maintained at on level (low level) corresponds to an (n/2)th first period of the second gate clock signal GCK2 with reference to a start time of each vertical scanning period (a period indicated by an arrow given reference character 71 in FIG. 8). A period during which a second scanning signal PS(n−1) which is applied to a second scanning signal line connected to a second output terminal 39 of a unit circuit 3(n−1) of an (n−1)th stage is maintained at on level (low level) corresponds to an (n/2)th first period of the first gate clock signal GCK1 with reference to a start time of each vertical scanning period (a period indicated by an arrow given reference character 72 in FIG. 8). A period during which a second scanning signal PS(n+1) which is applied to a second scanning signal line connected to a second output terminal 39 of a unit circuit 3(n+1) of an (n+1)th stage is maintained at on level (low level) corresponds to an ((n/2)+1)th first period of the first gate clock signal GCK1 with reference to a start time of each vertical scanning period (a period indicated by an arrow given reference character 73 in FIG. 8). A period during which a first scanning signal NS(n) which is applied to a first scanning signal line connected to a first output terminal 38 of the unit circuit 3(n) of the nth stage is maintained at on level (high level) corresponds to a period from a start time of the (n/2)th first period of the first gate clock signal GCK1 to a start time of the ((n/2)+1)th first period of the first gate clock signal GCK1 with reference to a start time of each vertical scanning period (a period from time t15 to time t19 of FIG. 8).

Note that in the above description it is assumed that n is an even number, but when n is an odd number, the periods are as follows. A period during which a second scanning signal PS(n) which is applied to a second scanning signal line connected to a second output terminal 39 of a unit circuit 3(n) of an nth stage is maintained at on level (low level) corresponds to an ((n+1)/2)th first period of the first gate clock signal GCK1 with reference to a start time of each vertical scanning period. A period during which a second scanning signal PS(n−1) which is applied to a second scanning signal line connected to a second output terminal 39 of a unit circuit 3(n−1) of an (n−1)th stage is maintained at on level (low level) corresponds to an ((n−1)/2)th first period of the second gate clock signal GCK2 with reference to a start time of each vertical scanning period. A period during which a second scanning signal PS(n+1) which is applied to a second scanning signal line connected to a second output terminal 39 of a unit circuit 3(n+1) of an (n+1)th stage is maintained at on level (low level) corresponds to an (((n−1)/2)+1)th first period of the second gate clock signal GCK2 with reference to a start time of each vertical scanning period. A period during which a first scanning signal NS(n) which is applied to a first scanning signal line connected to a first output terminal 38 of the unit circuit 3(n) of the nth stage is maintained at on level (high level) corresponds to a period from a start time of the ((n−1)/2)th first period of the second gate clock signal GCK2 to a start time of the (((n−1)/2)+1)th first period of the second gate clock signal GCK2 with reference to a start time of each vertical scanning period.

<1.4.2 Operation of the Pixel Circuit>

Figure 9:
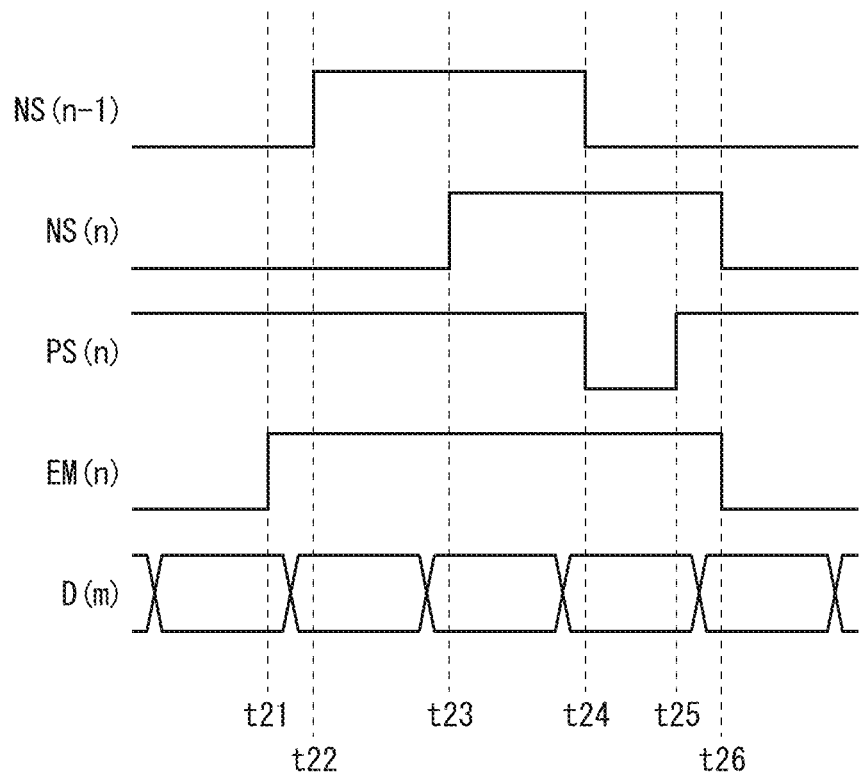
FIG. 9 is a timing chart for describing operation of a pixel circuit in the first embodiment.

FIG. 9 is a timing chart for describing operation of the pixel circuit 20 in the nth row (the pixel circuit 20 shown in FIG. 3). Prior to time t21, a second scanning signal PS(n) is at high level, and a first scanning signal NS(n−1), a first scanning signal NS(n), and a light emission control signal EM(n) are at low level. At this time, the power supply control transistor T5 and the light emission control transistor T6 are in on state, and the organic EL element 21 emits light depending on the magnitude of a drive current.

At time t21, the light emission control signal EM(n) changes from low level to high level. By this, the power supply control transistor T5 and the light emission control transistor T6 go into off state. As a result, supply of the current to the organic EL element 21 is interrupted, and the organic EL element 21 goes into turn-off state.

At time t22, the first scanning signal NS(n−1) changes from low level to high level. By this, the first initialization transistor T1 goes into on state. As a result, the gate voltage of the drive transistor T4 is initialized. That is, the gate voltage of the drive transistor T4 becomes equal to the initialization voltage Vini. Note that at time t22, in the pixel circuit 20 in the (n−1)th row, the threshold voltage compensation transistor T2 goes into on state.

At time t23, the first scanning signal NS(n) changes from low level to high level. By this, the threshold voltage compensation transistor T2 and the second initialization transistor T7 go into on state. By the second initialization transistor T7 going into on state, the anode voltage of the organic EL element 21 is initialized based on the initialization voltage Vini.

At time t24, the first scanning signal NS(n−1) changes from high level to low level. By this, the first initialization transistor T1 goes into off state. In addition, at time t24, the second scanning signal PS(n) changes from high level to low level. By this, the write control transistor T3 goes into on state. Since the threshold voltage compensation transistor T2 goes into on state at time t23, by the write control transistor T3 going into on state at time t24, a data signal D(m) is provided to the second electrode of the holding capacitor Ca through the write control transistor T3, the drive transistor T4, and the threshold voltage compensation transistor T2. By this, the holding capacitor Ca is charged. Note that at time t24, in the pixel circuit 20 in the (n−1)th row, the threshold voltage compensation transistor T2 goes into off state.

At time t25, the second scanning signal PS(n) changes from low level to high level. By this, the write control transistor T3 goes into off state.

At time t26, the first scanning signal NS(n) changes from high level to low level. By this, the threshold voltage compensation transistor T2 and the second initialization transistor T7 go into off state. In addition, at time t26, the light emission control signal EM(n) changes from high level to low level. By this, the power supply control transistor T5 and the light emission control transistor T6 go into on state, and a drive current based on the charged voltage in the holding capacitor Ca is supplied to the organic EL element 21. As a result, the organic EL element 21 emits light depending on the magnitude of the drive current. Thereafter, the organic EL element 21 emits light throughout a period until the next time when the light emission control signal EM(n) changes from low level to high level.

As described above, when taking a look at a period from time t22 to time t26 of FIG. 9, after the threshold voltage compensation transistor T2 in the pixel circuit 20 in the (n−1)th row changes from off state to on state, the threshold voltage compensation transistor T2 in the pixel circuit 20 in the nth row changes from off state to on state, and then after the threshold voltage compensation transistor T2 in the pixel circuit 20 in the (n−1)th row changes from on state to off state, the threshold voltage compensation transistor T2 in the pixel circuit 20 in the nth row changes from on state to off state. In addition, at time t24, the write control transistor T3 in the pixel circuit 20 in the nth row changes from off state to on state at the same timing as when the threshold voltage compensation transistor T2 in the pixel circuit 20 in the (n−1)th row changes from on state to off state.

In addition, the write control transistor T3 is maintained in on state during a period from time t24 to time t25, whereas the threshold voltage compensation transistor T2 is maintained in on state during a period from time t23 to time t26. In other words, a period during which the second scanning signal which is applied to the second scanning signal line connected to the control terminal of the write control transistor T3 is maintained at on level is included in a period during which the first scanning signal which is applied to the first scanning signal line connected to the control terminal of the threshold voltage compensation transistor T2 is maintained at on level. Here, if an LTPS-TFT is adopted as the write control transistor T3, then by maintaining the write control transistor T3 in on state during a period which is a part of the period during which the threshold voltage compensation transistor T2 is maintained in on state, charging (writing) of the capacitor Ca based on the data signal D(m) is sufficiently performed. This is because the LIPS-TFT has high mobility and enables high speed writing.

<1.5 Measures Against Leakage Current>

Figure 10:
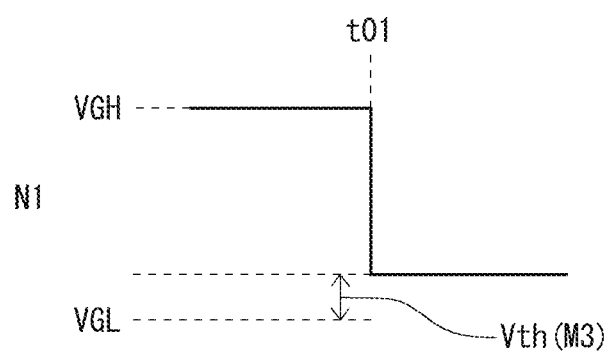
FIG. 10 is a diagram for describing a potential at a first internal node in the first embodiment.

At time t01 of FIG. 7, with the changes of the first control clock CK1 and the set signal S from high level to low level, the potential at the first internal node N1 decreases. Regarding this, it is ideal that the potential at the first internal node N1 decrease to the gate low potential VGL, but in practice, as shown in FIG. 10, the potential at the first internal node N1 decreases only to a potential higher by the threshold voltage Vth(M3) of the transistor M3 than the gate low potential VGL. That is, during a period from time t01 to time t03 and a period from time t04 to time t05 of FIG. 7, the potential at the first internal node N1 is a potential higher by the threshold voltage Vth(M3) of the transistor M3 than the gate low potential VGL. Here, if the threshold voltage of the transistor M5 is smaller than the threshold voltage Vth(M3) of the transistor M3, then leakage current may occur between the second conductive terminal and first conductive terminal of the transistor M5.

Hence, to suppress occurrence of leakage current in the transistor M5, it is desirable that the threshold voltage of the transistor M3 be smaller than the threshold voltage of the transistor M5. In addition, since the IGZO-TFT has a characteristic that off-leakage is remarkably small, it is desirable that the transistor M5 be an IGZO-TFT.

<1.6 Effects>

According to the present embodiment, the unit circuits 3 included in the shift register 301 in the gate driver 300 each include a first output circuit 321 that applies a first scanning signal to a first scanning signal line NS for driving N-type transistors in a pixel circuit 20; and a second output circuit 322 that applies a second scanning signal to a second scanning signal line PS for driving P-type transistors in the pixel circuit 20. The first output circuit 321 includes a P-type transistor M4 and an N-type transistor M5, and rising of the first scanning signal is performed through the transistor M4, and falling of the first scanning signal is performed through the transistor M5. Hence, a difference between a potential in a rise state of the first scanning signal and a potential in a fall state of the first scanning signal is sufficiently large, and thus, the on and off of the N-type transistors in the pixel circuit 20 are securely performed. In addition, the second output circuit 322 includes a P-type transistor M1 and a capacitor C1 that functions as a boost capacitance, and the falling and rising of the second scanning signal are performed through the capacitor C1. Hence, a difference between a potential in a fall state of the second scanning signal and a potential in a rise state of the second scanning signal is sufficiently large, and thus, the on and off of the P-type transistors in the pixel circuit 20 are securely performed. Here, IGZO-TFTs can be adopted as the N-type transistors in the pixel circuit 20, and LTPS-TFTs can be adopted as the P-type transistors in the pixel circuit 20. Thus, according to the present embodiment, it becomes possible to implement an organic EL display device that includes the pixel circuits (pixel circuits in which N-type transistors and P-type transistors coexist or pixel circuits in which IGZO-TFTs and LTPS-TFTs coexist) 20, in each of which a plurality of types of transistors coexist, and that operates normally, while suppressing an increase in processing cost. In addition, since the unit circuit 3 includes a small number of circuit elements (transistors, etc.), narrowing of a picture-frame can be easily achieved.

2. Second Embodiment

<2.1 Regarding Flow-Through Current>

In the first embodiment, in a pixel circuit 20 in an nth row, the control terminal of the first initialization transistor T1 is connected to a first scanning signal line NS(n−1) in an (n−1)th row, the control terminal of the threshold voltage compensation transistor T2 is connected to a first scanning signal line NS(n) in the nth row, and the control terminal of the write control transistor T3 is connected to a second scanning signal line PS(n) in the nth row (see FIG. 3). In such a configuration, flow-through current may flow through the pixel circuit 20, which will be described below.

Figure 11:
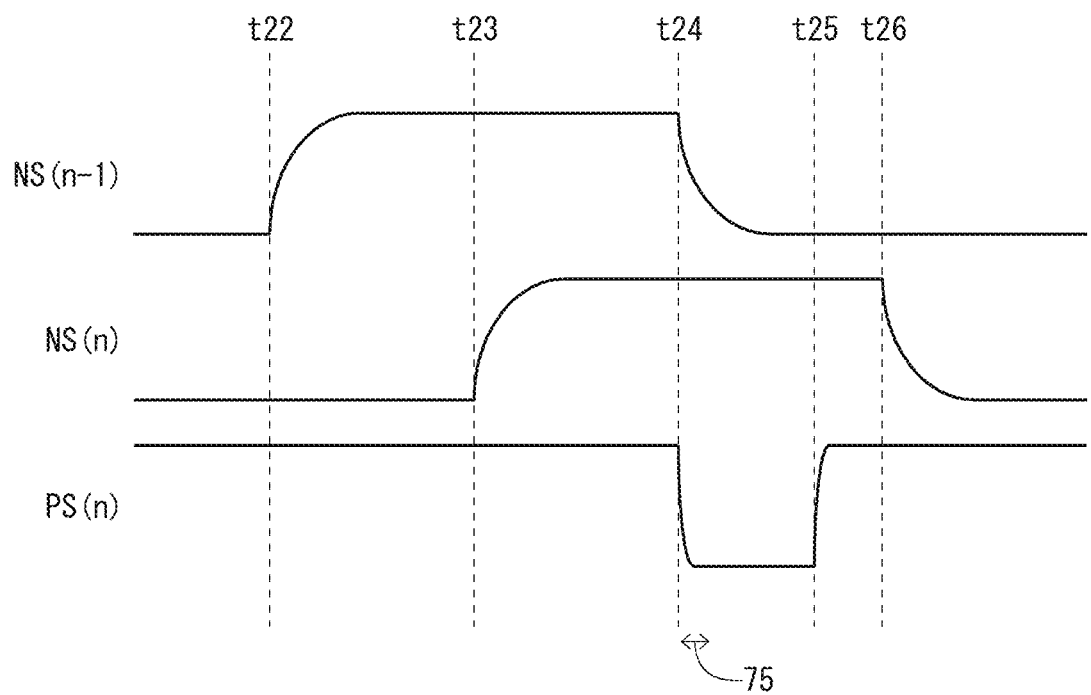
FIG. 11 is a diagram for describing a delay in waveforms of first scanning signals and a second scanning signal for a second embodiment.
Figure 12:
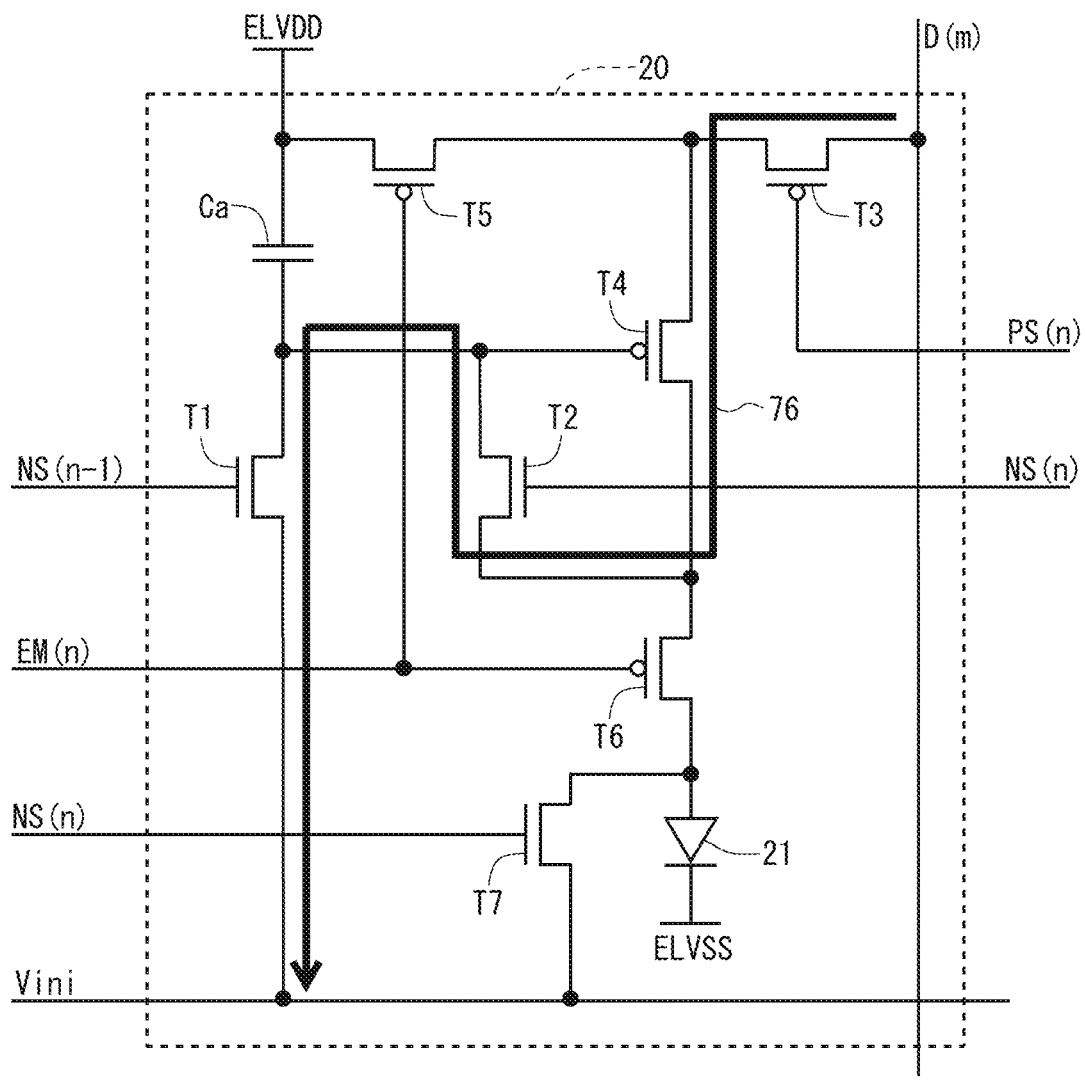
FIG. 12 is a diagram for describing flow-through current occurring in a pixel circuit for the second embodiment.

Although in FIG. 9 a delay in waveforms of the first scanning signals and the second scanning signal is not taken into account, in practice, a delay occurs in the waveforms. Thus, of the signals shown in FIG. 9, the first scanning signal NS(n−1), the first scanning signal NS(n), and the second scanning signal PS(n) actually have waveforms such as those shown in FIG. 11. Here, when taking a look at a period indicated by an arrow given reference character 75 in FIG. 11, during this period, the first scanning signal NS(n−1) has not sufficiently fallen. Therefore, during this period, in the pixel circuit 20 in the nth row, the first initialization transistor T1, the threshold voltage compensation transistor T2, and the write control transistor T3 are all in on state. By this, as indicated by an arrow given reference character 76 in FIG. 12, flow-through current flows from a data signal line D to an initialization power line. Hence, in the present embodiment, in order to prevent occurrence of flow-through current, a configuration shown below is adopted.

<2.2 Configuration of a Pixel Circuit>

Figure 13:
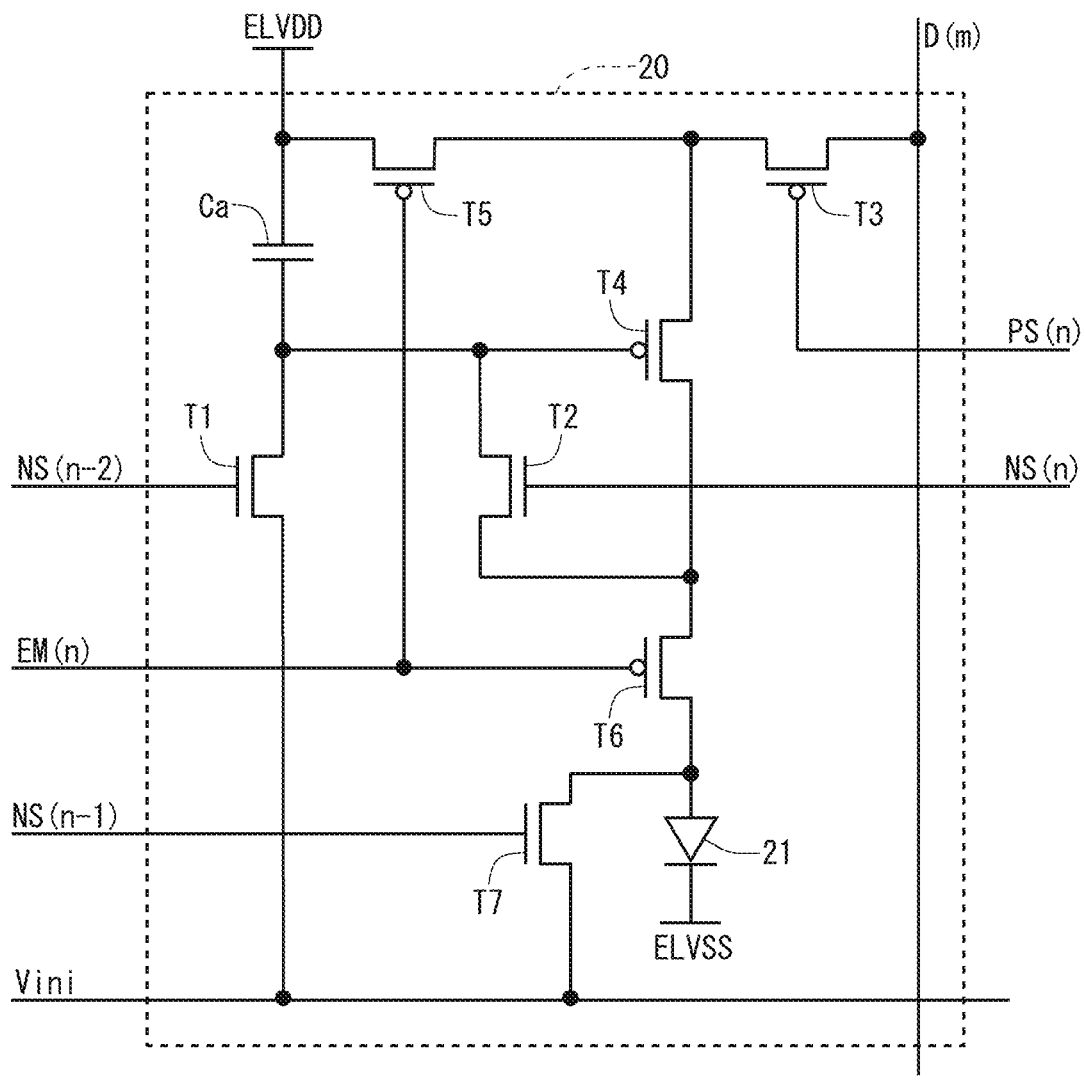
FIG. 13 is a circuit diagram showing a configuration of a pixel circuit in an nth row and an mth column in the second embodiment.

FIG. 13 is a circuit diagram showing a configuration of a pixel circuit 20 in an nth row and an mth column of the present embodiment. Unlike the first embodiment (see FIG. 3), the control terminal of the first initialization transistor T1 is connected to a first scanning signal line NS(n−2) in an (n−2)th row, and the control terminal of the second initialization transistor T7 is connected to a first scanning signal line NS(n−1) in an (n−1)th row. Except for those differences, the configuration is the same as that of the first embodiment. Note that in the present embodiment, the same drive signal (first scanning signal) is provided to the first scanning signal line connected to the control terminal of the first initialization transistor T1 in the pixel circuit 20 in the nth row and the first scanning signal line connected to the control terminal of the threshold voltage compensation transistor T2 in the pixel circuit 20 in the (n−2)th row.

<2.3 Operation>

Figure 14:
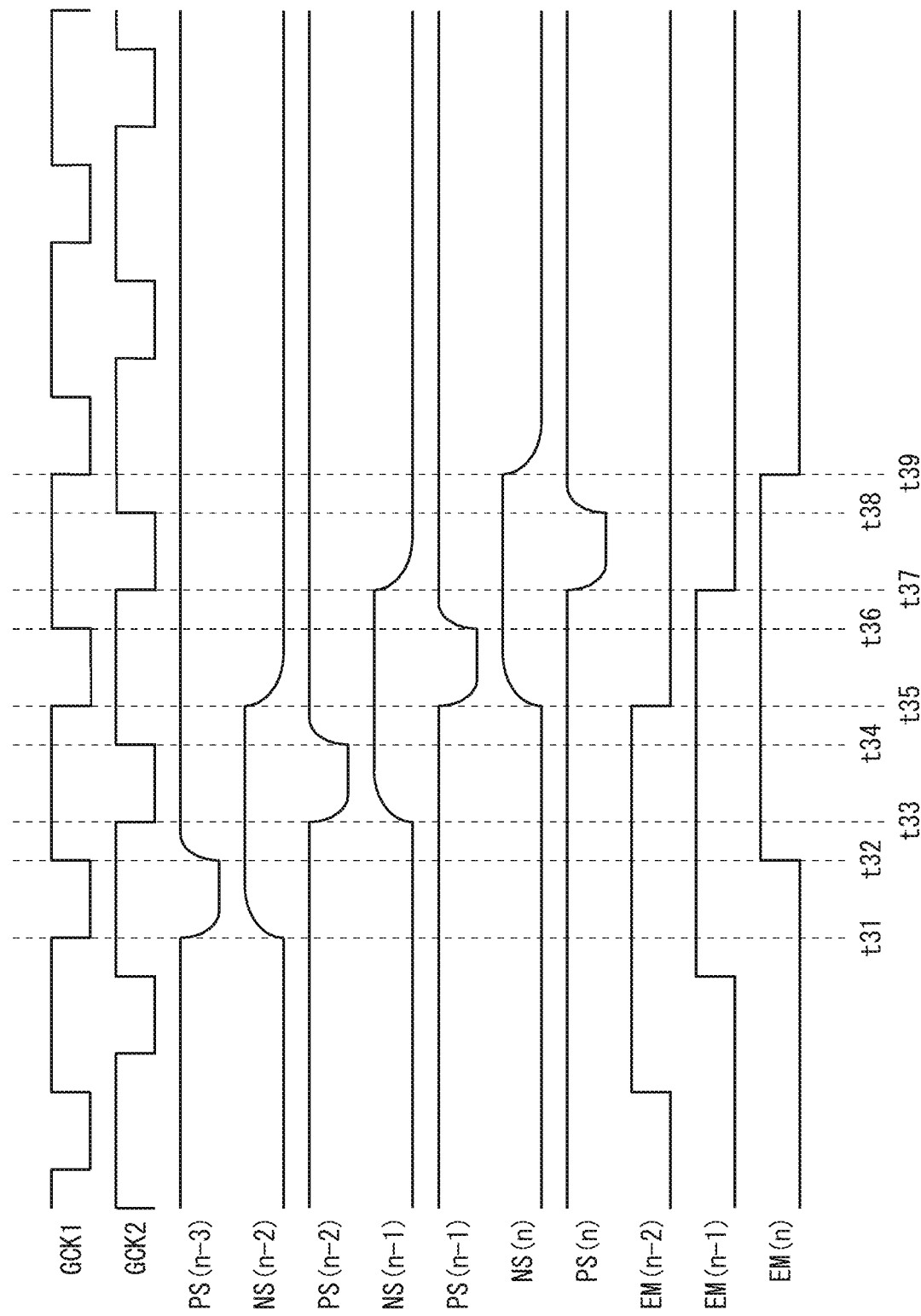
FIG. 14 is a timing chart showing waveforms of signals that control operation of pixel circuits from the (n−2)th to nth rows, etc., in the second embodiment.

Since the configuration of the unit circuits 3 is the same as that of the first embodiment, the unit circuits 3 operate in the same manner as in the first embodiment. Thus, waveforms of signals that control operation of pixel circuits 20 from the (n−2)th to nth rows, etc., are such as those shown in FIG. 14. Note that in FIG. 14 a delay in waveforms of first scanning signals NS and second scanning signals PS is taken into account.

Figure 15:
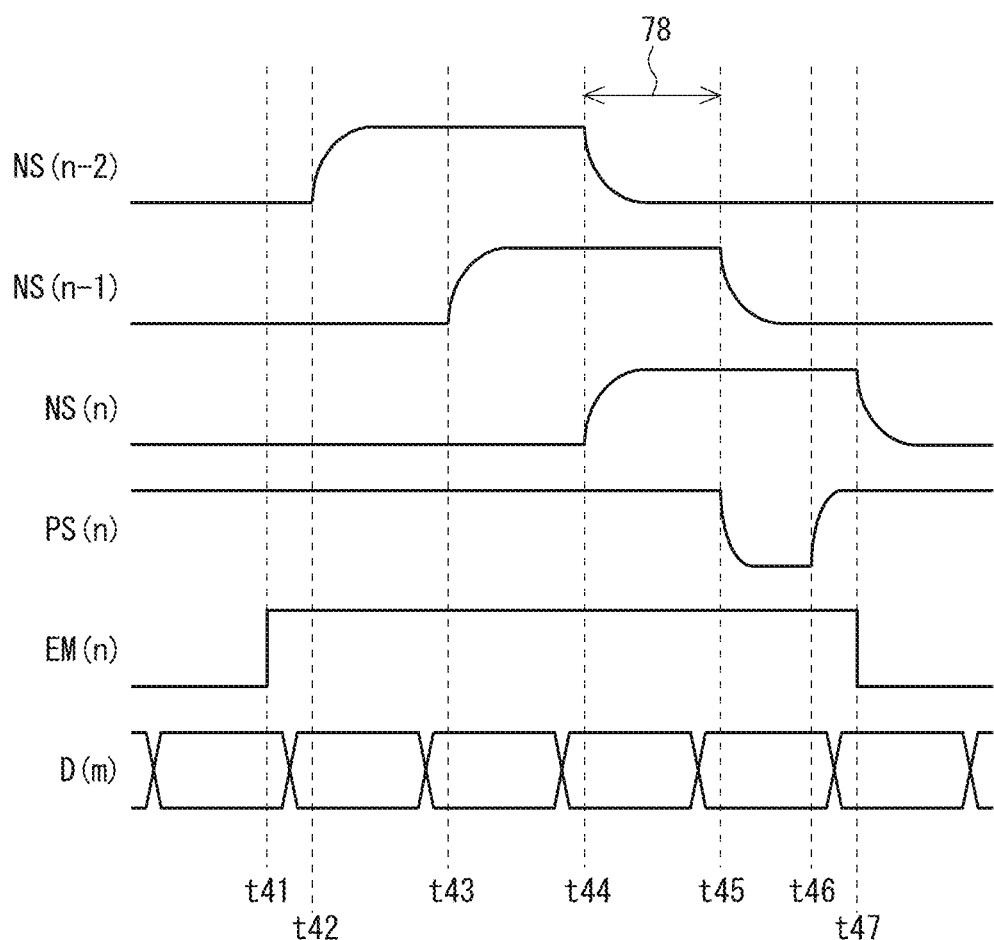
FIG. 15 is a timing chart for describing operation of a pixel circuit in the second embodiment.

FIG. 15 is a timing chart for describing operation of the pixel circuit 20 in the nth row (the pixel circuit 20 shown in FIG. 13). Prior to time t41, a second scanning signal PS(n) is at high level, and a first scanning signal NS(n−2), a first scanning signal NS(n−1), a first scanning signal NS(n), and a light emission control signal EM(n) are at low level. At this time, the power supply control transistor T5 and the light emission control transistor T6 are in on state, and the organic EL element 21 emits light depending on the magnitude of a drive current.

At time t41, the light emission control signal EM(n) changes from low level to high level. By this, the power supply control transistor T5 and the light emission control transistor T6 go into off state. As a result, supply of the current to the organic EL element 21 is interrupted, and the organic EL element 21 goes into turn-off state.

At time t42, the first scanning signal NS(n−2) changes from low level to high level. By this, the first initialization transistor T1 goes into on state. As a result, the gate voltage of the drive transistor T4 is initialized. That is, the gate voltage of the drive transistor T4 becomes equal to the initialization voltage Vini.

At time t43, the first scanning signal NS(n−1) changes from low level to high level. By this, the second initialization transistor T7 goes into on state, and the anode voltage of the organic EL element 21 is initialized based on the initialization voltage Vini.

At time t44, the first scanning signal NS(n) changes from low level to high level. By this, the threshold voltage compensation transistor T2 goes into on state. In addition, at time t44, the first scanning signal NS(n−2) changes from high level to low level. By this, the first initialization transistor T1 goes into off state.

At time t45, the first scanning signal NS(n−1) changes from high level to low level. By this, the second initialization transistor T7 goes into off state. In addition, at time t45, the second scanning signal PS(n) changes from high level to low level. By this, the write control transistor T3 goes into on state. Since the threshold voltage compensation transistor T2 goes into on state at time t44, by the write control transistor T3 going into on state at time t45, a data signal D(m) is provided to the second electrode of the holding capacitor Ca through the write control transistor T3, the drive transistor T4, and the threshold voltage compensation transistor T2. By this, the holding capacitor Ca is charged.

At time t46, the second scanning signal PS(n) changes from low level to high level. By this, the write control transistor T3 goes into off state.

At time t47, the first scanning signal NS(n) changes from high level to low level. By this, the threshold voltage compensation transistor T2 goes into off state. In addition, at time t47, the light emission control signal EM(n) changes from high level to low level. By this, the power supply control transistor T5 and the light emission control transistor T6 go into on state, and a drive current based on the charged voltage in the holding capacitor Ca is supplied to the organic EL element 21. As a result, the organic EL element 21 emits light depending on the magnitude of the drive current. Thereafter, the organic EL element 21 emits light throughout a period until the next time when the light emission control signal EM(n) changes from low level to high level.

<2.4 Effects>

In the present embodiment, as shown in FIG. 15, a sufficient period (a period indicated by an arrow given reference character 78 in FIG. 15) is provided between time t44 at which the first scanning signal NS(n−2) provided to the control terminal of the first initialization transistor T1 starts to fall and time t45 at which the second scanning signal PS(n) provided to the control terminal of the write control transistor T3 starts to fall. Hence, in the pixel circuit 20, the first initialization transistor T1 and the write control transistor T3 do not simultaneously go into on state. Therefore, flow-through current such as that indicated by the arrow given reference character 76 in FIG. 12 does not flow through the pixel circuit 20. Thus, according to the present embodiment, not only the same effects as those obtained in the first embodiment, but also an effect of preventing occurrence of flow-through current in the pixel circuits 20 can be obtained.

<2.5 Variant>

Although the control terminal of the second initialization transistor T7 is connected to the first scanning signal line NS(n−1) in the (n−1)th row in the second embodiment, the configuration is not limited thereto. The control terminal of the second initialization transistor T7 may be connected to, for example, the first scanning signal line NS(n−2) in the (n−2)th row. That is, as long as initialization of the anode voltage of the organic EL element 21 is performed during a non-light emission period (a period during which the light emission control signal EM(n) is maintained at high level), where the control terminal of the second initialization transistor T7 is connected is not particularly limited.

3. Third Embodiment

<3.1 Configurations of Pixel Circuits>

Figure 16:
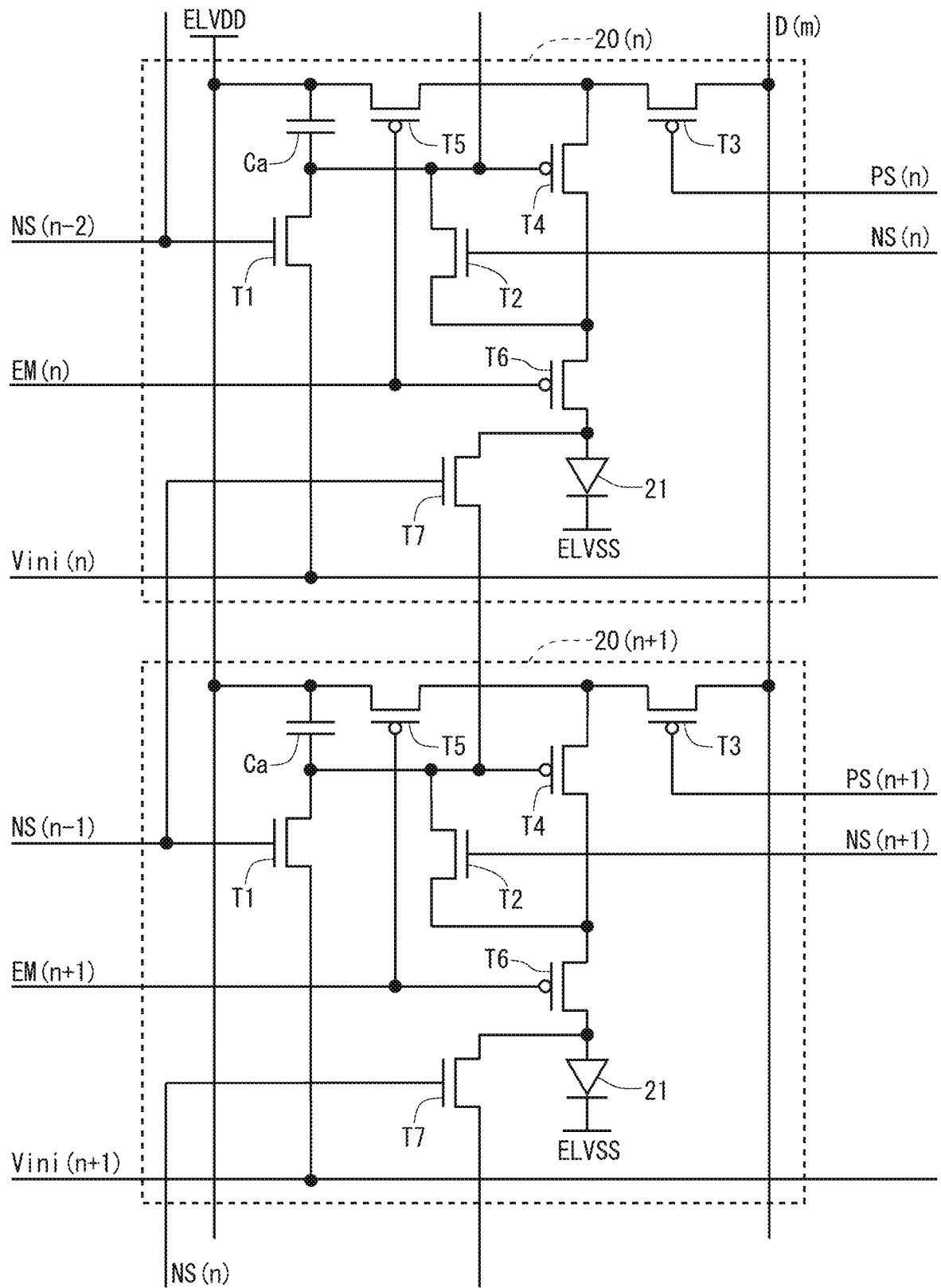
FIG. 16 is a circuit diagram showing configurations of a pixel circuit in an nth row and an mth column and a pixel circuit in an (n+1)th row and the mth column in a third embodiment.

FIG. 16 is a circuit diagram showing configurations of a pixel circuit 20(n) in an nth row and an mth column and a pixel circuit 20(n+1) in an (n+1)th row and the mth column in the present embodiment. As can be grasped from FIGS. 13 and 16, except for the second initialization transistor T7, the configurations of the transistors T1 to T6 are the same as those of the second embodiment. Note, however, that the control terminal of the first initialization transistor T1 may be connected to a first scanning signal line NS(n−1) in an (n−1)th row as in the first embodiment.

The second initialization transistor T7 in the pixel circuit 20(n) in the nth row is connected at its control terminal to the control terminal of the first initialization transistor T1 in the pixel circuit 20(n+1) in the (n+1)th row (connected to the first scanning signal line NS(n−1) in the (n−1)th row), connected at its first conductive terminal to the second conductive terminal of the light emission control transistor T6 and the anode terminal of the organic EL element 21, and connected at its second conductive terminal to the first conductive terminal of the first initialization transistor T1, the second conductive terminal of the threshold voltage compensation transistor T2, the control terminal of the drive transistor T4, and the second electrode of the holding capacitor Ca in the pixel circuit 20(n+1) in the (n+1)th row.

As described above, a second initialization transistor T7 in a pixel circuit 20 in a given row is connected in series with a first initialization transistor T1 in a pixel circuit 20 in a row subsequent to the given row. In such a configuration, if the first initialization transistor T1 and the second initialization transistor T7 do not have excellent off-leakage characteristics, then erroneous operation caused by leakage current may occur. Hence, in the present embodiment, IGZO-TFTs are adopted as the first initialization transistor T1 and the second initialization transistor T7.

Figure 17:
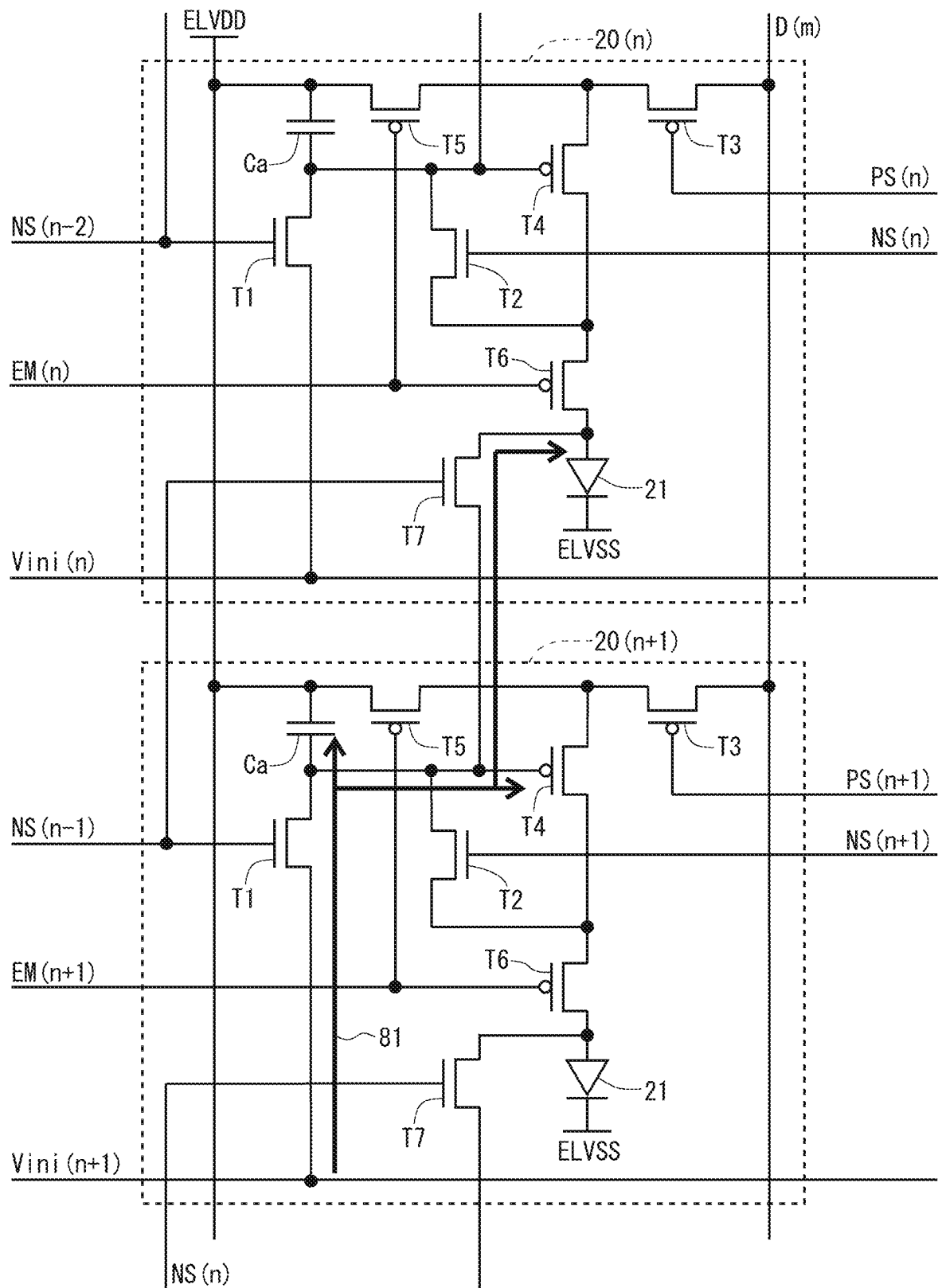
FIG. 17 is a diagram for describing a path for initialization in the third embodiment.

By adopting a configuration such as that described above, initialization (initialization of the gate voltage of the drive transistor T4 and initialization of the anode voltage of the organic EL element 21) is performed in a manner indicated by an arrow given reference character 81 in FIG. 17, without causing erroneous operation.

<3.2 Effects>

According to the present embodiment, a second initialization transistor T7 in a pixel circuit 20 in a given row is connected in series with a first initialization transistor T1 in a pixel circuit 20 in a row subsequent to the given row. Hence, a transistor that is directly connected to an initialization power line is only the first initialization transistor T1. By this, a load on the initialization power line decreases, enabling supply of a stable potential with high noise immunity to the pixel circuits 20. Note that the effects obtained in the first embodiment can also be obtained.

4. Fourth Embodiment

<4.1 Configuration of a Unit Circuit>

Figure 18:
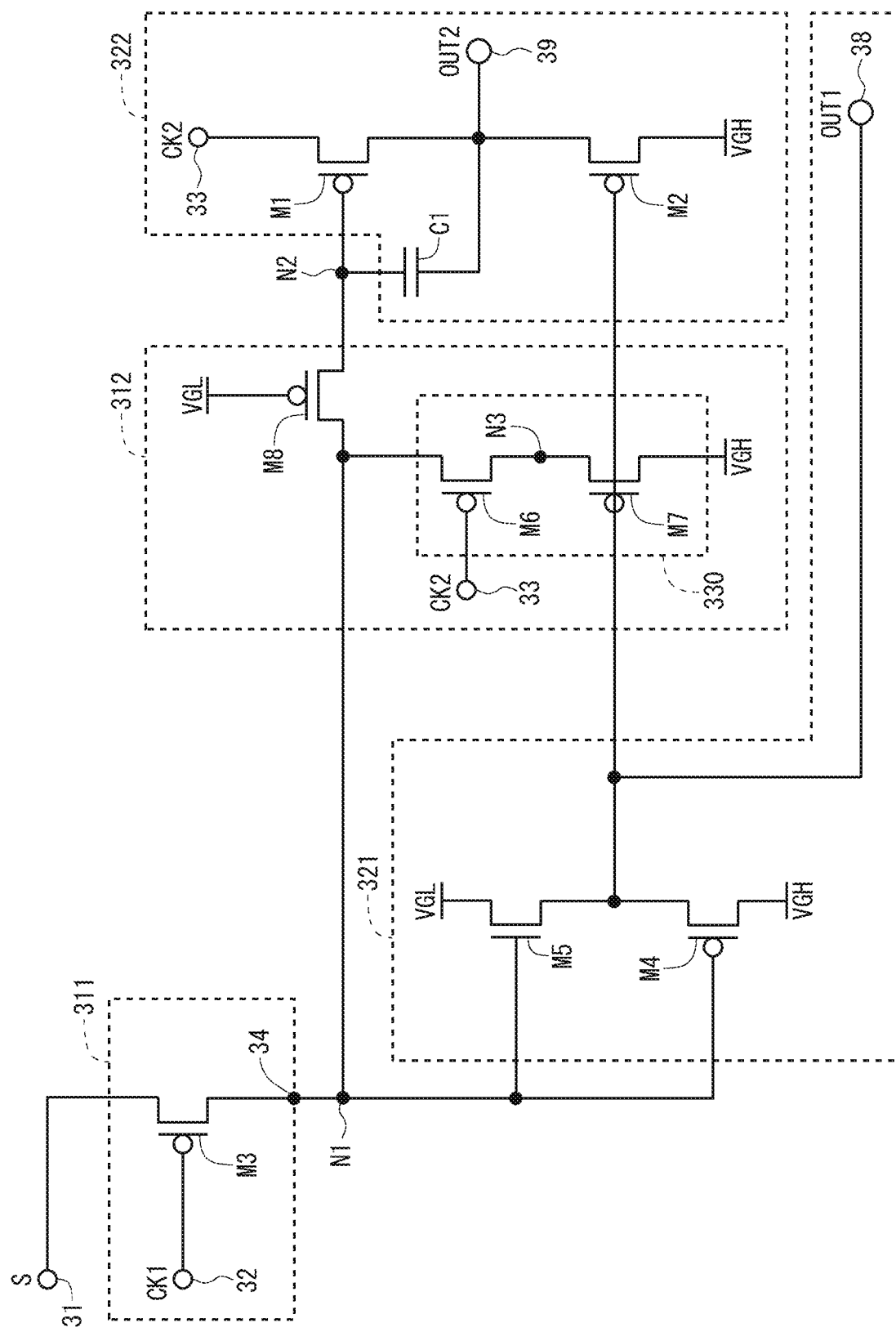
FIG. 18 is a circuit diagram showing a configuration of a unit circuit in a gate driver in a fourth embodiment.

FIG. 18 is a circuit diagram showing a configuration of a unit circuit 3 of the present embodiment. The unit circuit 3 of the present embodiment includes a second control circuit 312 that controls the potential at the first internal node N1, in addition to the first control circuit 311, the first output circuit 321, and the second output circuit 322. The second control circuit 312 includes a stabilization circuit 330 and a transistor M8. The stabilization circuit 330 includes a transistor M6 and a transistor M7. The transistors M6 to M8 are P-type transistors. Note that an output circuit control transistor is implemented by the transistor M8.

As shown in FIG. 18, a first conductive terminal of the transistor M6 is connected to a second conductive terminal of the transistor M7. Note that a node where they are connected to each other is referred to as "third internal node". The third internal node is given reference character N3.

The transistor M6 is connected at its control terminal to an input terminal 33, connected at its first conductive terminal to the third internal node N3, and connected at its second conductive terminal to the first internal node N1. The transistor M7 is connected at its control terminal to the first output terminal 38, connected at its first conductive terminal to the second constant potential line, and connected at its second conductive terminal to the third internal node N3. Thus, the transistor M6 and the transistor M7 are connected in series between the first internal node N1 and the second constant potential line. The transistor M8 is connected at its control terminal to the first constant potential line, connected at its first conductive terminal to the second internal node N2, and connected at its second conductive terminal to the first internal node N1.

<4.2 Operation of the Unit Circuit>

Figure 19:
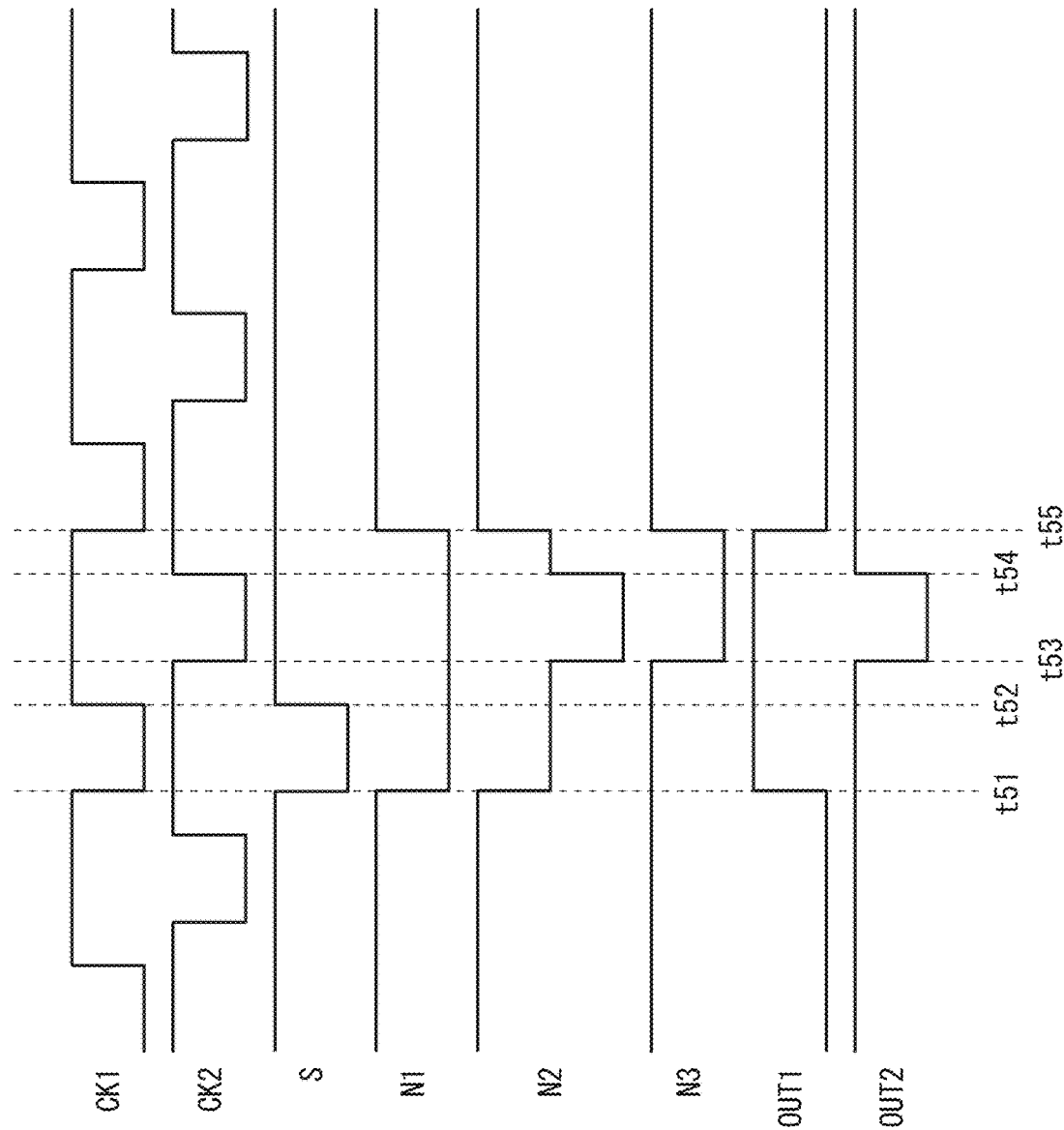
FIG. 19 is a timing chart for describing operation of the unit circuit in the fourth embodiment.

With reference to FIG. 19, operation of the unit circuit 3 will be described. During a period before time t51, the potentials at the first internal node N1 and the second internal node N2 are maintained at high level, the output signal OUT1 is maintained at low level, and the output signal OUT2 is maintained at high level. Note that since the output signal OUT1 is maintained at low level, the transistors M2 and M7 are maintained in on state.

At time t51, the first control clock CK1 changes from high level to low level. By this, the transistor M3 goes into on state. In addition, at time t51, the set signal S changes from high level to low level. By this, the potential at the first internal node N1 decreases to low level, and the transistor M4 goes into on state and the transistor M5 goes into off state. As a result, the output signal OUT1 changes from low level to high level. By this, the transistors M2 and M7 go into off state. In addition, even if the potential at the first internal node N1 decreases to low level, the transistor M8 is maintained in on state, and thus, the potential at the second internal node N2 also decreases to low level. By this, the transistor M1 goes into on state.

At time t52, the first control clock CK1 changes from low level to high level. By this, the transistor M3 goes into off state. In addition, at time t52, the set signal S changes from low level to high level.

At time t53, the second control clock CK2 changes from high level to low level. At this time, the transistor M1 is in on state, and thus, with a reduction in the potential at the input terminal 33, the potential at the second output terminal 39 (the potential of the output signal OUT2) decreases. Here, since the capacitor C1 is provided between the second internal node N2 and the second output terminal 39, with a reduction in the potential at the second output terminal 39, the potential at the second internal node N2 also decreases (the second internal node N2 goes into boost state). As a result of such boost operation, a large negative voltage is applied to the control terminal of the transistor M1, and the potential of the output signal OUT2 decreases to a level sufficient for a write control transistor T3 where the second output terminal 39 is connected to go into on state. Meanwhile, when the potential at the second internal node N2 decreases at time t53, the voltage between the control terminal and first conductive terminal of the transistor M8 reaches less than or equal to the threshold voltage of the transistor M8. By this, the transistor M8 goes into off state. Thus, at time t53, the potential at the first internal node N1 does not change.

At time t54, the second control clock CK2 changes from low level to high level. By this, with an increase in the potential at the input terminal 33, the potential at the second output terminal 39 (the potential of the output signal OUT2) increases. When the potential at the second output terminal 39 increases, the potential at the second internal node N2 also increases through the capacitor C1. By this, the transistor M8 goes into on state.

At time t55, the first control clock CK1 changes from high level to low level. By this, the transistor M3 goes into on state. At this time, the set signal S is maintained at high level. Hence, the potential at the first internal node N1 increases to high level, and the transistor M4 goes into off state and the transistor M5 goes into on state. As a result, the output signal OUT1 changes from high level to low level. By this, the transistors M2 and M7 go into on state. In addition, since the transistor M8 is maintained in on state, at time t55, the potential at the second internal node N2 also increases to high level. By this, the transistor M1 goes into off state.

During a period after time t55, as with the period before time t51, the potentials at the first internal node N1 and the second internal node N2 are maintained at high level, and the output signal OUT1 is maintained at low level and the output signal OUT2 is maintained at high level.

By the unit circuit 3 operating in the above-described manner, the pixel circuit 20 operates in the same manner as in the first embodiment. That is, the on and off of the N-type transistors and the P-type transistors in the pixel circuit 20 are securely performed.

Meanwhile, a parasitic capacitance is present in a transistor in the unit circuit 3. Hence, during the period before time t51 and the period after time t55, fluctuations can occur in the potentials at the first internal node N1 and the second internal node N2 due to the clock operation of the second control clock CK2 and the presence of a parasitic capacitance in the transistor M1. Accordingly, fluctuations can occur in the potentials of the output signal OUT1 and the output signal OUT2. However, during the period before time t51 and the period after time t55, the transistor M7 is maintained in on state, and every time the second control clock CK2 changes to low level, the transistor M6 goes into on state. When both the transistor M6 and the transistor M7 are in on state, the first internal node N1 is connected to the second constant potential line that supplies a gate high potential VGH. Thus, during the period before time t51 and the period after time t55, even if noise caused by the clock operation of the second control clock CK2 occurs, the potentials at the first internal node N1 and the second internal node N2 are securely maintained at high level.

Note that during a period from time t51 to time t53, the second control clock CK2 is at high level, and thus, the transistor M6 is maintained in off state. Thus, the potential at the third internal node N3 being maintained at high level does not influence the potentials at the first internal node N1 and the second internal node N2. In addition, at time t53, the transistor M7 is in off state, and thus, by the second control clock CK2 changing from high level to low level, the potential at the third internal node N3 also changes from high level to low level. Thereafter, the transistor M7 goes into on state at time t55 as described above, by which the potential at the third internal node N3 changes from low level to high level.

<4.3 Effects>

According to the present embodiment, by provision of the transistor M8 in the unit circuit 3, when the potential at the second internal node N2 decreases by boost operation, the potential at the first internal node N1 is maintained. Hence, compared to a case in which the transistor M8 is not provided, the amplitude of the potential at the first internal node N1 decreases. By this, stress applied to the control terminals of the transistors M4, M5 and stress applied to the second conductive terminals of the transistors M3 and M6 decrease. As a result, reliability improves. In addition, by provision of the stabilization circuit 330 in the unit circuit 3, during a period during which the output signal OUT1 is to be maintained at low level, even if noise caused by the clock operation of the second control clock CK2 occurs, the potentials at the first internal node N1 and the second internal node N2 are securely maintained at high level. As a result, occurrence of malfunctions such as a display failure caused by the clock operation of the second control clock CK2 is prevented.

<4.4 Variants>

Variants of the fourth embodiment will be described below.

<4.4.1 First Variant>

Figure 20:
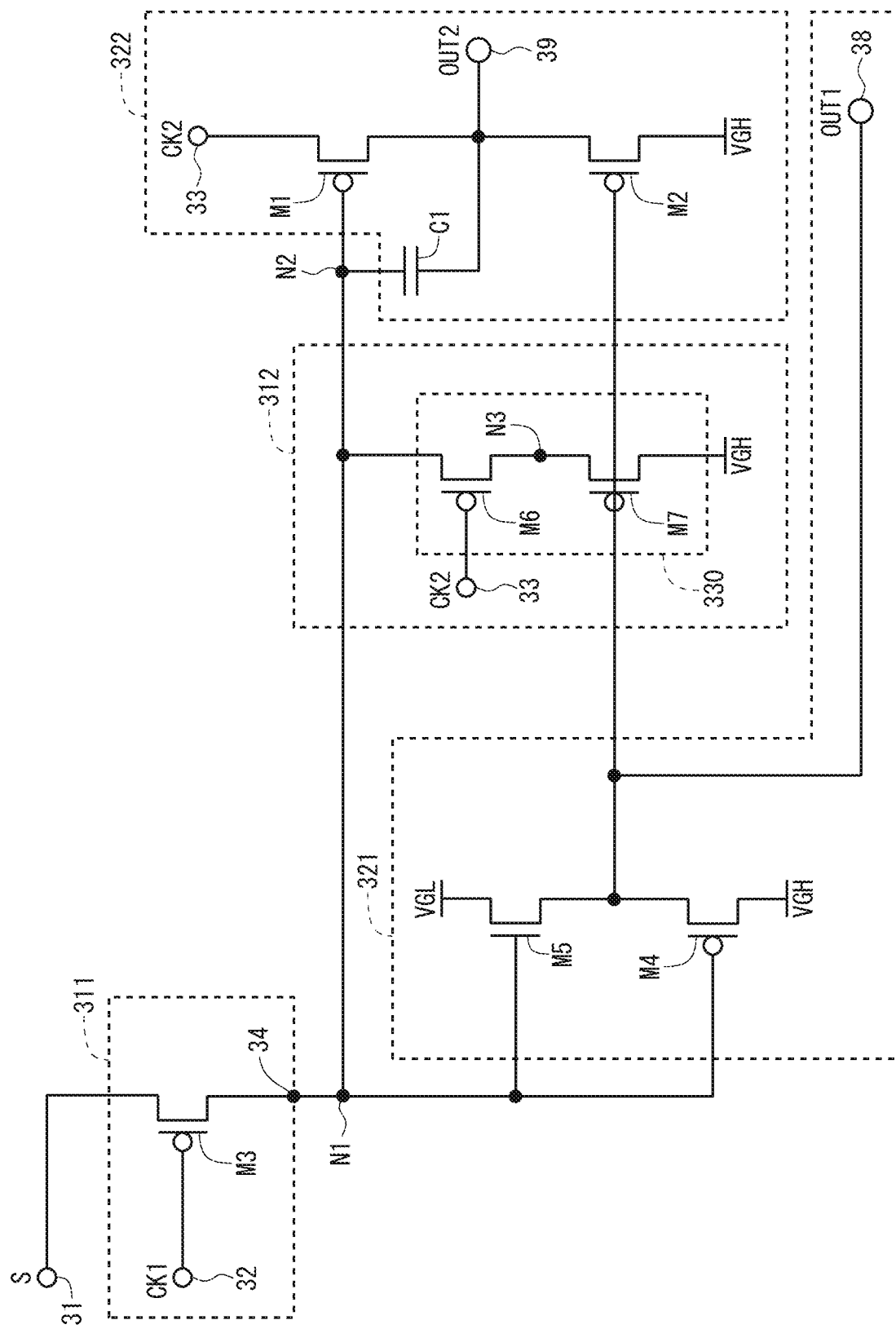
FIG. 20 is a circuit diagram showing a configuration of a unit circuit in the gate driver in a first variant of the fourth embodiment.

FIG. 20 is a circuit diagram showing a configuration of a unit circuit 3 of a first variant of the fourth embodiment. In the present variant, the second control circuit 312 includes the stabilization circuit 330 but does not include the transistor M8. By such a configuration, too, an effect of preventing occurrence of malfunctions such as a display failure caused by the clock operation of the second control clock CK2 can be obtained.

<4.4.2 Second Variant>

Figure 21:
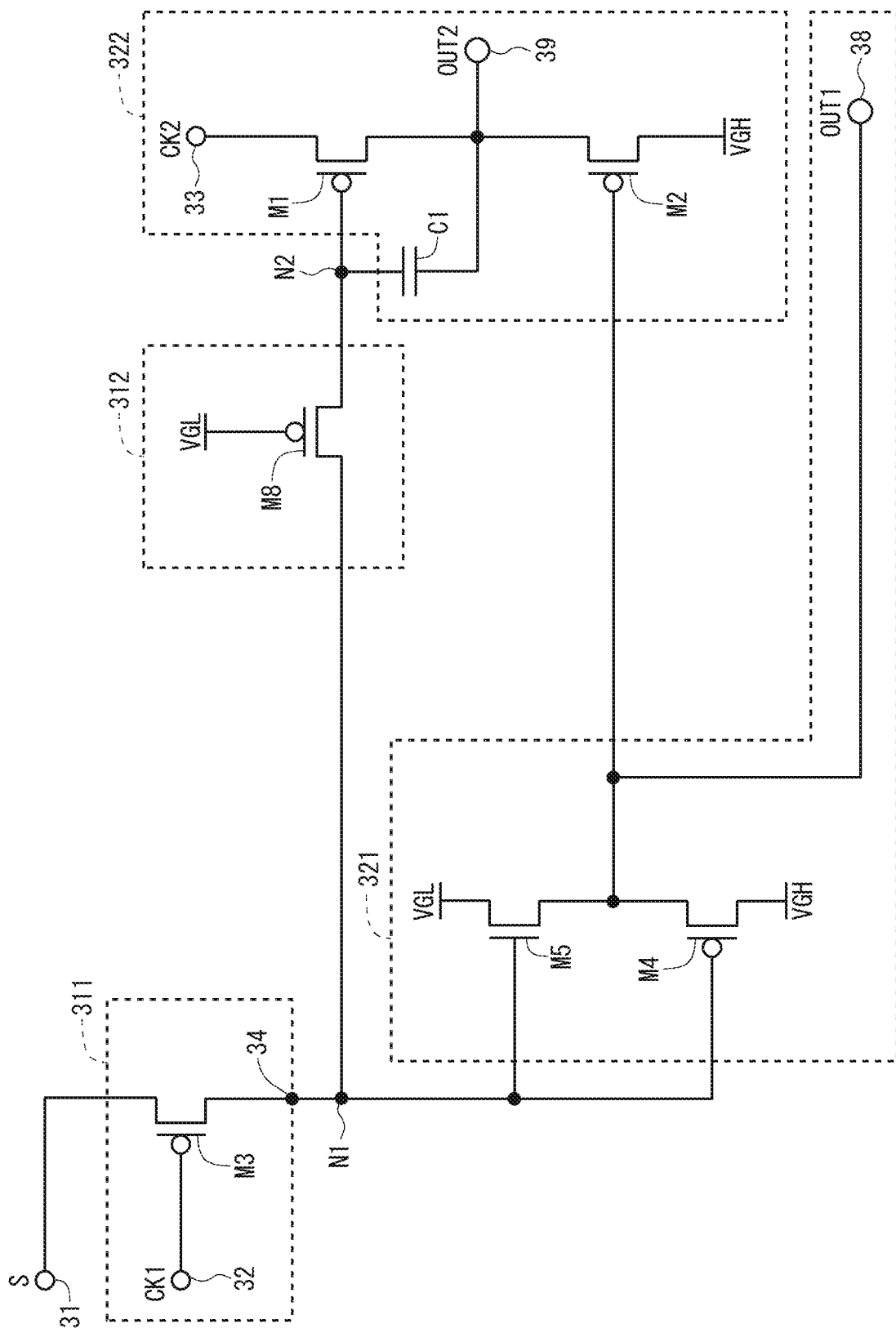
FIG. 21 is a circuit diagram showing a configuration of a unit circuit in the gate driver in a second variant of the fourth embodiment.

FIG. 21 is a circuit diagram showing a configuration of a unit circuit 3 of a second variant of the fourth embodiment. In the present variant, the second control circuit 312 includes the transistor M8 but does not include the stabilization circuit 330. By such a configuration, too, an effect of improving reliability by reducing stress applied to the control terminals of the transistors M4, M5 and stress applied to the second conductive terminal of the transistor M3 can be obtained.

5. Fifth Embodiment

<5.1 Configuration of a Unit Circuit>

Figure 22:
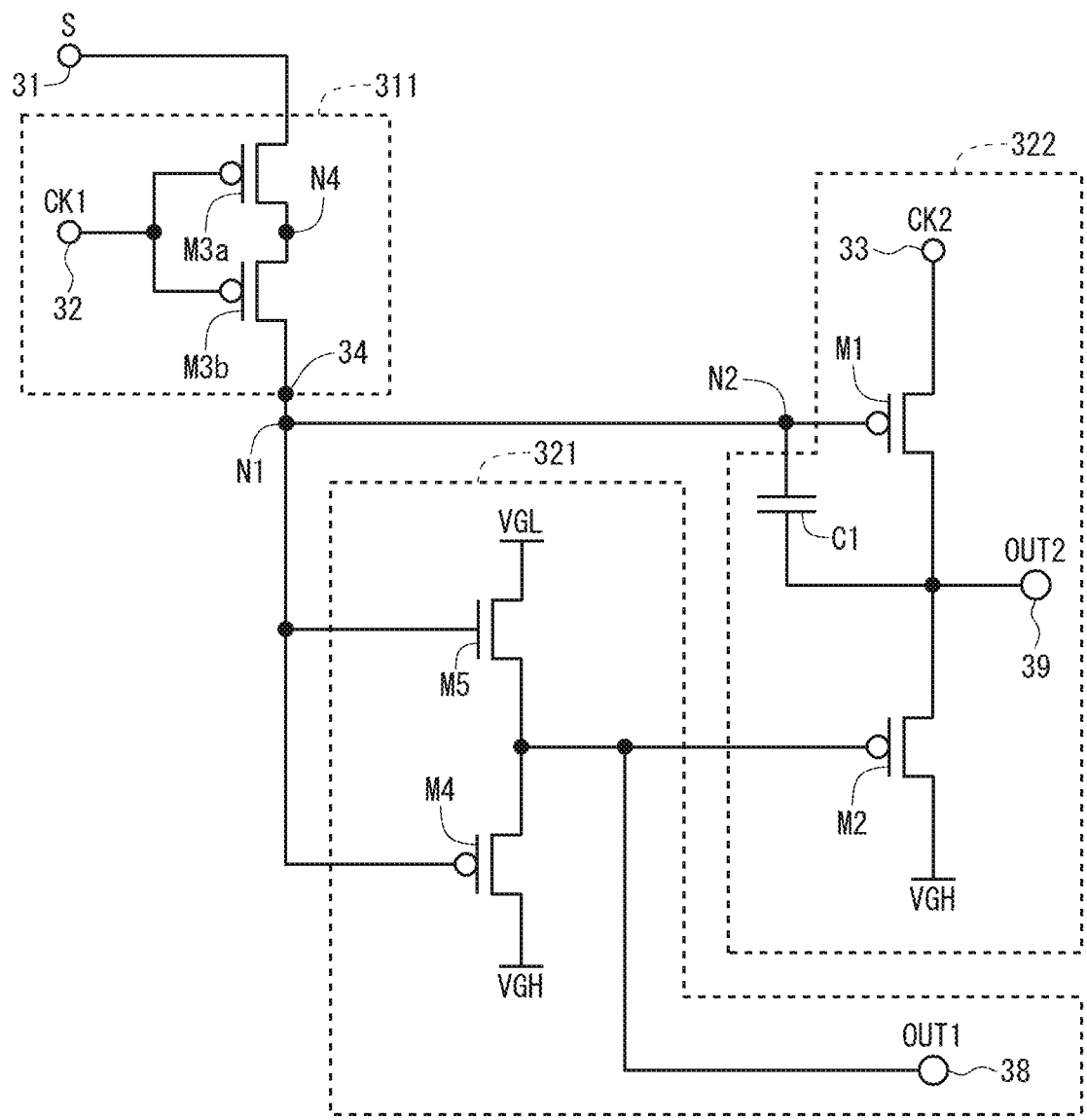
FIG. 22 is a circuit diagram showing a configuration of a unit circuit in a gate driver in a fifth embodiment.

FIG. 22 is a circuit diagram showing a configuration of a unit circuit 3 of the present embodiment. As can be grasped from FIGS. 1 and 22, a configuration obtained by replacing the transistor M3 in the unit circuit 3 of the first embodiment by two transistors (a transistor M3a and a transistor M3b) which are cascode-connected to each other is a configuration of a unit circuit 3 of the present embodiment.

The transistor M3a and the transistor M3b both are P-type transistors. A second conductive terminal of the transistor M3a is connected to a second conductive terminal of the transistor M3b. Note that a node where they are connected to each other is referred to as "fourth internal node". The fourth internal node is given reference character N4. The transistor M3a is connected at its control terminal to the input terminal 32, connected at its first conductive terminal to the input terminal 31, and connected at its second conductive terminal to the fourth internal node N4. The transistor M3b is connected at its control terminal to the input terminal 32, connected at its first conductive terminal to the first internal node N1, and connected at its second conductive terminal to the fourth internal node N4. Thus, the transistor M3a and the transistor M3b are connected in series between the input terminal 31 (i.e., the second output terminal 39 of another unit circuit 3) and the first internal node N1.

<5.2 Effects>

According to a configuration in which one transistor M3 is provided between the input terminal 31 and the first internal node N1 as in the first embodiment, upon the above-described boost operation, the voltage between the first conductive terminal and second conductive terminal of the transistor M3 becomes large. That is, the transistor M3 is subjected to large voltage stress by the boost operation. By this, the characteristics of the transistor M3 vary. As a result, an abnormality in operation of the unit circuit 3 is likely to occur, reducing the reliability of the gate driver 300.

On the other hand, according to the present embodiment, two transistors (the transistor M3a and the transistor M3b) are provided between the input terminal 31 and the first internal node N1. Here, regarding boost operation, given that the voltage between the input terminal 31 and the first internal node N1 is Vx, the voltage between the input terminal 31 and the fourth internal node N4 is Vy, and the voltage between the first internal node N1 and the fourth internal node N4 is Vz, Vy is smaller than Vx and Vz is smaller than Vx. As such, voltage stress received by one transistor upon boost operation is small compared to that of the first embodiment. Thus, according to the present embodiment, variation in the characteristics of the transistors provided between the input terminal 31 and the first internal node N1 is suppressed, improving the reliability of the gate driver 300.

In addition, according to the present embodiment, since two transistors are provided between the input terminal 31 and the first internal node N1 as described above, the magnitude of leakage current between the input terminal 31 and the first internal node N1 at a time when the first control clock CK1 is at high level is smaller than that of the first embodiment. In terms of this, too, the reliability of the gate driver 300 improves.

<5.3 Variant>

Figure 23:
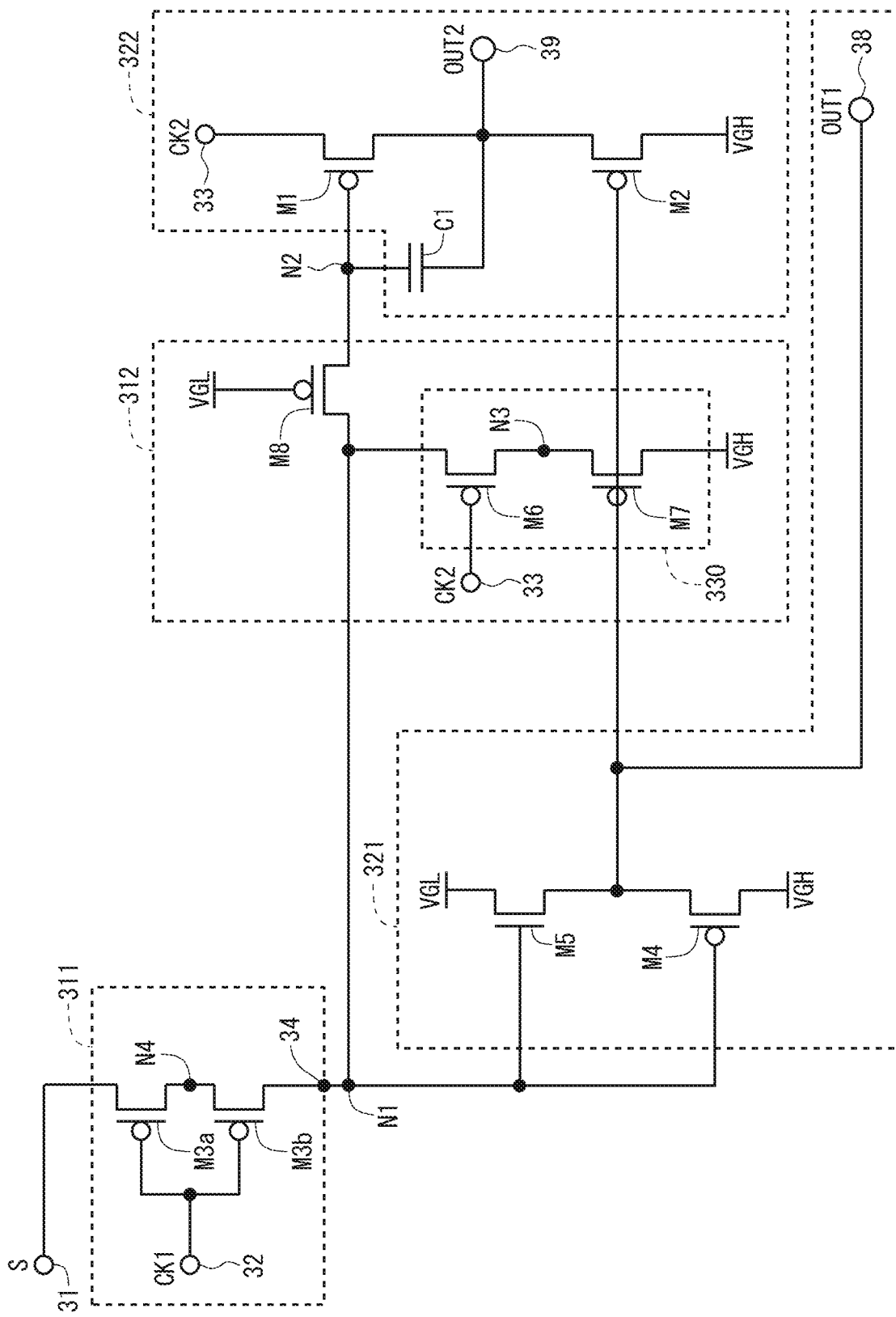
FIG. 23 is a circuit diagram showing a configuration of a unit circuit in the gate driver in a variant of the fifth embodiment.

In the fifth embodiment, the transistor M3 in the unit circuit 3 of the first embodiment is replaced by two transistors (the transistor M3a and the transistor M3b). However, the configuration is not limited thereto, and the transistor M3 in the unit circuit 3 of the fourth embodiment (see FIG. 18) may be replaced by two transistors (the transistor M3a and the transistor M3b) as shown in FIG. 23. According to the present variant, not only the same effects as those obtained in the fourth embodiment, but also an effect of improving the reliability of the gate driver 300 can be obtained.

6. Sixth Embodiment

<6.1 Configuration of a Unit Circuit>

Figure 24:
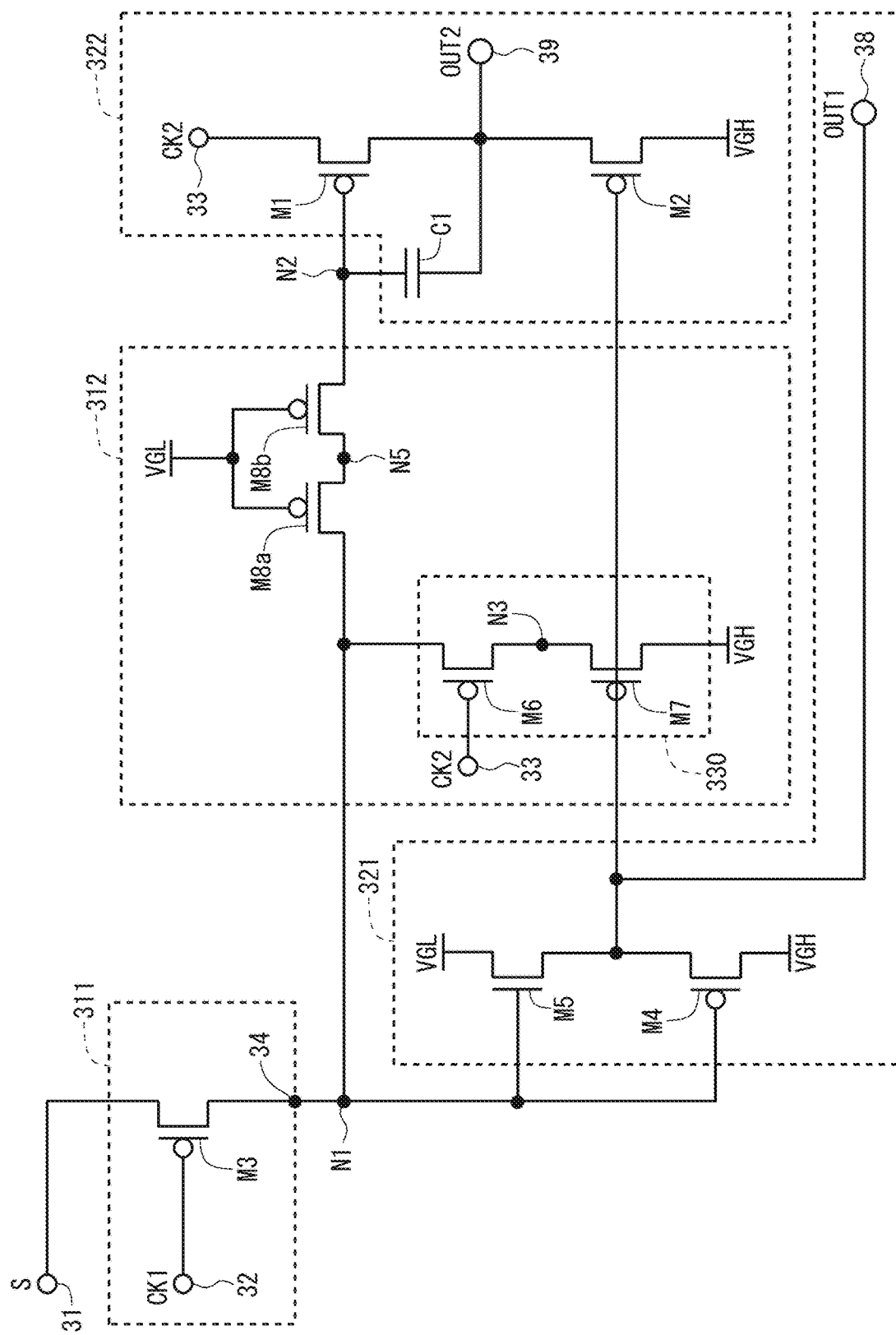
FIG. 24 is a circuit diagram showing a configuration of a unit circuit in a gate driver in a sixth embodiment.

FIG. 24 is a circuit diagram showing a configuration of a unit circuit 3 of the present embodiment. As can be grasped from FIGS. 18 and 24, a configuration obtained by replacing the transistor M8 in the unit circuit 3 of the fourth embodiment by two transistors (a transistor M8a and a transistor M8b) which are cascode-connected to each other is a configuration of a unit circuit 3 of the present embodiment.

The transistor M8a and the transistor M8b both are P-type transistors. A second conductive terminal of the transistor M8a is connected to a second conductive terminal of the transistor M8b. Note that a node where they are connected to each other is referred to as "fifth internal node". The fifth internal node is given reference character N5. The transistor M8a is connected at its control terminal to the first constant potential line, connected at its first conductive terminal to the first internal node N1, and connected at its second conductive terminal to the fifth internal node N5. The transistor M8b is connected at its control terminal to the first constant potential line, connected at its first conductive terminal to the second internal node N2, and connected at its second conductive terminal to the fifth internal node N5. Thus, the transistor M8a and the transistor M8b are connected in series between the first internal node N1 and the second internal node N2. Note that an output circuit control unit is implemented by the transistor M8a and the transistor M8b.

<6.2 Effects>

According to a configuration in which one transistor M8 is provided between the first internal node N1 and the second internal node N2 as in the fourth embodiment, upon the above-described boost operation, the voltage between the first conductive terminal and second conductive terminal of the transistor M8 becomes large. That is, the transistor M8 is subjected to large voltage stress by the boost operation. By this, the characteristics of the transistor M8 vary. As a result, an abnormality in operation of the unit circuit 3 is likely to occur, reducing the reliability of the gate driver 300.

On the other hand, according to the present embodiment, two transistors (the transistor M8a and the transistor M8b) are provided between the first internal node N1 and the second internal node N2. Here, regarding boost operation, given that the voltage between the first internal node N1 and the second internal node N2 is Vx, the voltage between the first internal node N1 and the fifth internal node N5 is Vy, and the voltage between the second internal node N2 and the fifth internal node N5 is Vz, Vy is smaller than Vx and Vz is smaller than Vx. As such, voltage stress received by one transistor upon boost operation is small compared to that of the fourth embodiment. Thus, according to the present embodiment, variation in the characteristics of the transistors provided between the first internal node N1 and the second internal node N2 is suppressed, improving the reliability of the gate driver 300. Note that the same effects as those obtained in the fourth embodiment can also be obtained.

7. Seventh Embodiment

<7.1 Configuration of a Unit Circuit>

Figure 25:
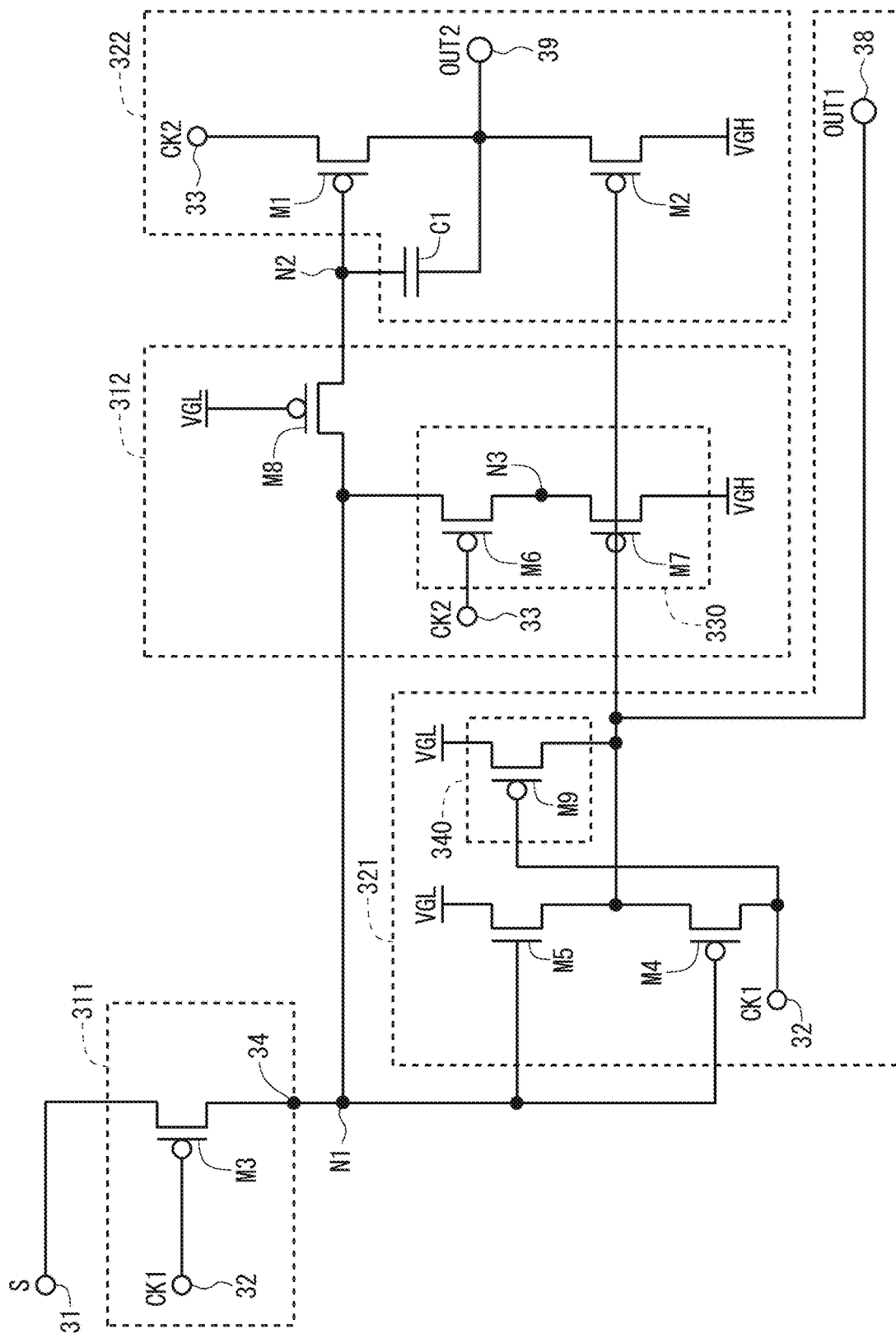
FIG. 25 is a circuit diagram showing a configuration of a unit circuit in a gate driver in a seventh embodiment.

FIG. 25 is a circuit diagram showing a configuration of a unit circuit 3 of the present embodiment. In the present embodiment, as in the fourth embodiment, the unit circuit 3 includes the first control circuit 311, the second control circuit 312, the first output circuit 321, and the second output circuit 322. Note, however, that the configuration of the first output circuit 321 differs from that of the fourth embodiment (see FIG. 18).

In the present embodiment, the first output circuit 321 includes a reset circuit 340 for bringing the output signal OUT1 to low level, in addition to the transistor M4 and transistor M5. The reset circuit 340 includes a transistor M9. The transistor M9 is a P-type transistor. The transistor M9 is connected at its control terminal to the input terminal 32, connected at its first conductive terminal to the first output terminal 38, and connected at its second conductive terminal to the first constant potential line. In addition, although the first conductive terminal of the transistor M4 is connected to the second constant potential line in the fourth embodiment, the first conductive terminal of the transistor M4 is connected to the input terminal 32 in the present embodiment. Note that a reset transistor is implemented by the transistor M9.

<7.2 Operation of the Unit Circuit>

Figure 26:
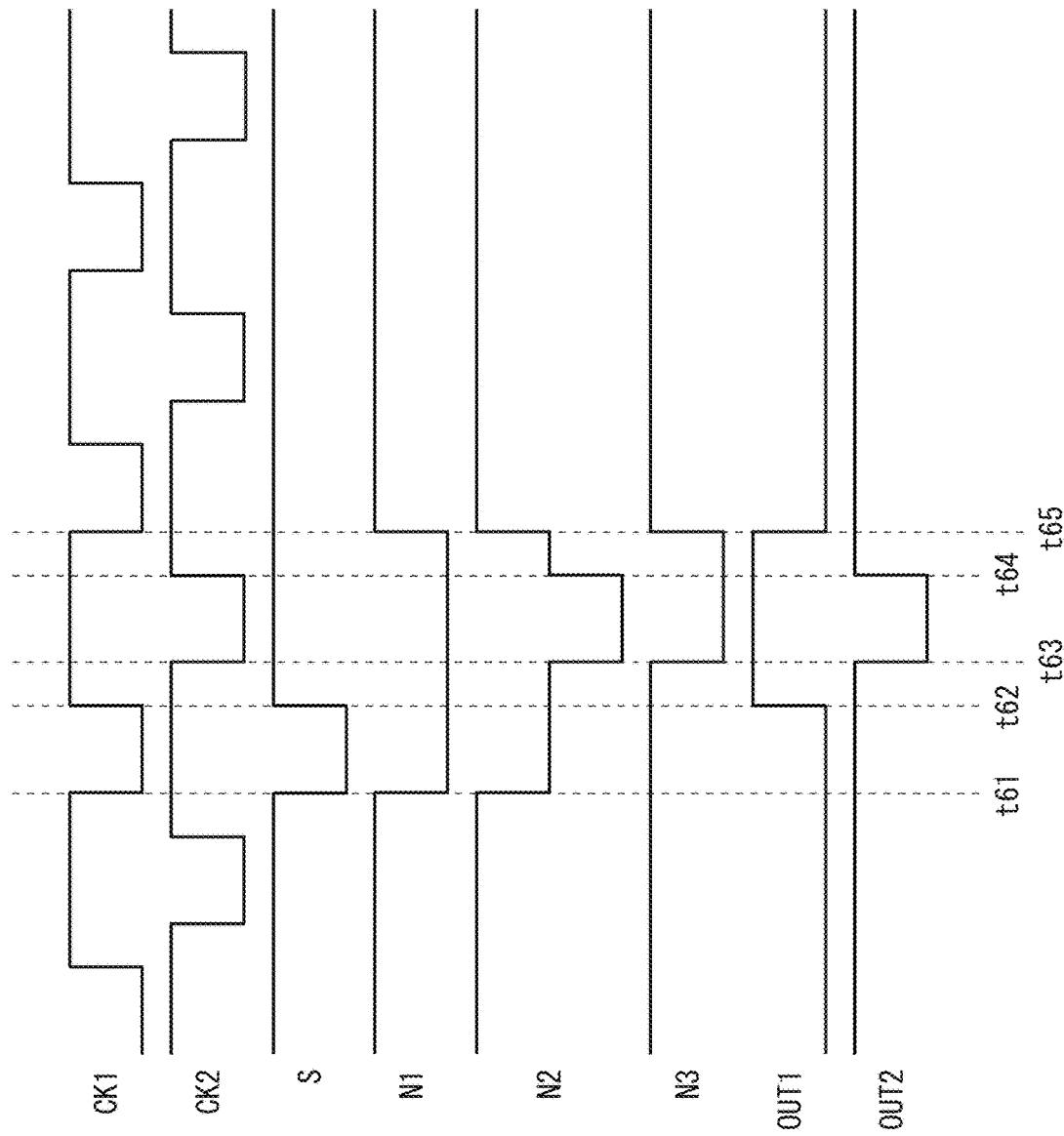
FIG. 26 is a timing chart for describing operation of the unit circuit in the seventh embodiment.

With reference to FIG. 26, operation of the unit circuit 3 will be described. Note, however, that differences from the fourth embodiment (see FIG. 19) will be mainly described. A period from time t61 to time t65 of FIG. 26 corresponds to a period from time t51 to time t55 of FIG. 19.

At time t61, as in the fourth embodiment, the potential at the first internal node N1 decreases to low level, and the transistor M4 goes into on state and the transistor M5 goes into off state. At this time, since the first conductive terminal of the transistor M4 is connected to the input terminal 32 to which the first control clock CK1 is provided, the potential at the first conductive terminal of the transistor M4 is at low level. In addition, since the control terminal of the transistor M9 is also connected to the input terminal 32, at time t61, the transistor M9 goes into on state. Thus, the output signal OUT1 is maintained at low level. By this, the transistors M2 and M7 are maintained in on state.

At time t62, the first control clock CK1 changes from low level to high level. By this, the potential at the first conductive terminal of the transistor M4 changes to high level. In addition, at time t62, the transistor M9 goes into off state. Thus, the output signal OUT1 changes from low level to high level. Operations at time t63 and t64 are the same as those at time t53 and t54 of the fourth embodiment (see FIG. 19).

At time t65, as in the fourth embodiment, the potential at the first internal node N1 increases to high level, and the transistor M4 goes into off state and the transistor M5 goes into on state. In addition, at time t65, the transistor M9 goes into on state. At time t65, the transistor M5 and the transistor M9 go into on state as described above, and thus, the output signal OUT1 changes from high level to low level.

<7.3 Effects>

According to the present embodiment, not only the same effects as those obtained in the fourth embodiment, but also effects such as those shown below can be obtained. In the first output circuit 321 in the unit circuit 3, as transistors for allowing the output signal OUT1 to fall, the transistor M5 of N-type and the transistor M9 of P-type are provided. Regarding this, for example, in a case where the transistor M5 is an IGZO-TFT and the transistor M9 is an LTPS-TFT, since the LTPS-TFT has higher drive capability than the IGZO-TFT, even if the total size of the transistor M5 and the transistor M9 is made smaller than the size of the transistor M5 of the fourth embodiment (the size of the transistor M5 in a case where only the transistor M5 of N-type is provided as a transistor for allowing the output signal OUT1 to fall), the output signal OUT1 can be allowed to fall as in the fourth embodiment. As such, since the overall size of the transistors for allowing the output signal OUT1 to fall can be reduced, it becomes possible to achieve narrowing of a picture-frame of the organic EL display panel 6.

Note that in a case of the above-described example, not only the transistor M9 but also the transistor M5 contributes to falling of the output signal OUT1. Thus, rising of the output signal OUT1 is performed through the transistor M4, and falling of the output signal OUT1 is performed through the transistors M5 and M9. Therefore, in the present embodiment, too, a difference between a potential in a rise state of the first scanning signal (output signal OUT1) and a potential in a fall state of the first scanning signal (output signal OUT1) is sufficiently large, and thus, the on and off of the N-type transistors in the pixel circuit 20 are securely performed.

8. Eighth Embodiment

<8.1 Configuration of a Unit Circuit>

Figure 27:
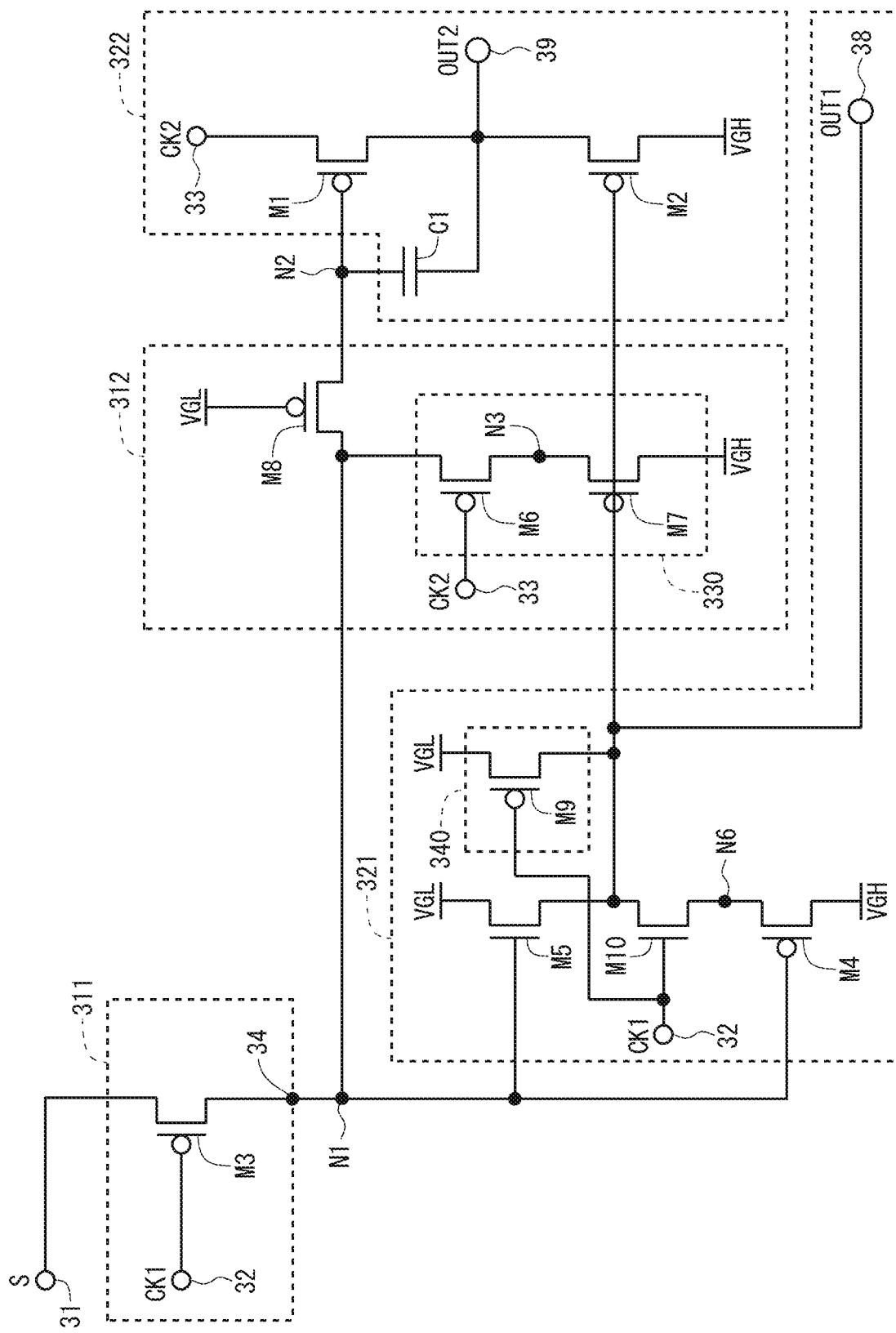
FIG. 27 is a circuit diagram showing a configuration of a unit circuit in a gate driver in an eighth embodiment.
Figure 28:
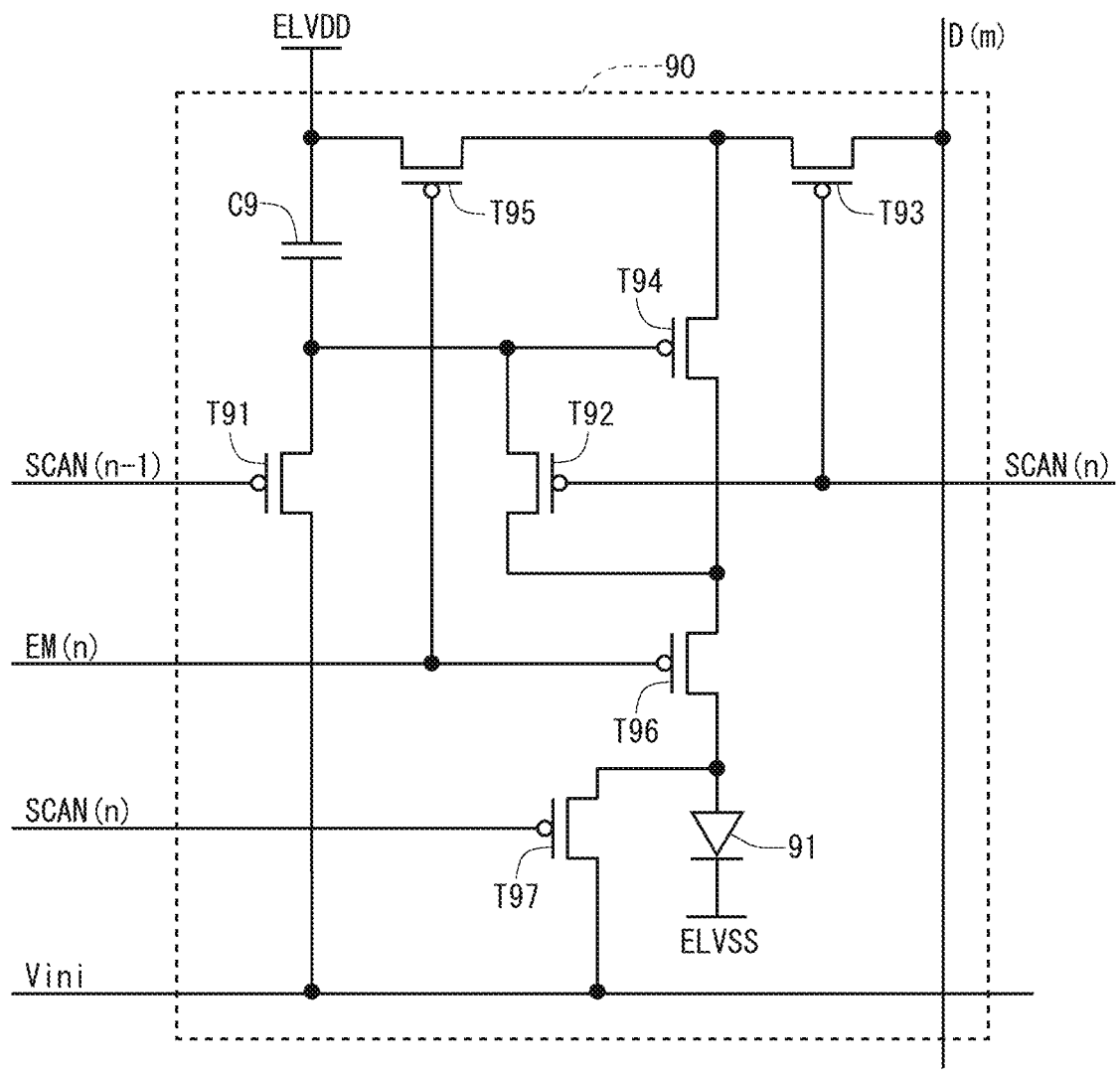
FIG. 28 is a circuit diagram showing a configuration of a pixel circuit of a known example.

FIG. 27 is a circuit diagram showing a configuration of a unit circuit 3 of the present embodiment. As can be grasped from FIGS. 25 and 27, the configuration of the first output circuit 321 differs from that of the seventh embodiment. Other than that, the configuration is the same as that of the seventh embodiment.

In the present embodiment, the first output circuit 321 includes a transistor M10 that functions as a relay transistor, in addition to the transistors M4, M5, and M9. The transistor M10 is an N-type transistor. A second conductive terminal of the transistor M4 is connected to a first conductive terminal of the transistor M10. Note that a node where they are connected to each other is referred to as "sixth internal node". The sixth internal node is given reference character N6. The transistor M10 is connected at its control terminal to the input terminal 32, connected at its first conductive terminal to the sixth internal node N6, and connected at its second conductive terminal to the first output terminal 38. In addition, although the first conductive terminal of the transistor M4 is connected to the input terminal 32 in the seventh embodiment, the first conductive terminal of the transistor M4 is connected to the second constant potential line in the present embodiment.

<8.2 Effects>

According to the present embodiment, after the transistor M4 goes into on state by a decrease in the potential at the first internal node N1, at a time point at which the output signal OUT1 is to rise (at time t62 of FIG. 26), the first control clock CK1 changes from low level to high level, by which the transistor M9 changes from on state to off state, and the transistor M10 changes from off state to on state. Here, the first conductive terminal of the transistor M4 is connected to the second constant potential line that supplies a gate high potential VGH. Thus, during a period during which both the transistors M4 and M10 are in on state, the output signal OUT1 rises through the transistors M4 and M10. At this time, charge is not supplied from a clock signal line that supplies the first gate clock signal GCK1 or the second gate clock signal GCK2, but is supplied from the second constant potential line. Hence, compared to the seventh embodiment, a drive load of a clock required for rising of the output signal OUT1 decreases. Thus, according to the present embodiment, not only the same effects as those obtained in the seventh embodiment, but also an effect of reducing a drive load of a clock required for rising of the output signal OUT1 can be obtained.

9. Others

Although description is made using an organic EL display device as an example in the above-described embodiments and variants, the present disclosure is not limited thereto and can also be applied to an inorganic EL display device, a QLED display device, etc.

DESCRIPTION OF REFERENCE CHARACTERS

3: UNIT CIRCUIT
6: ORGANIC EL DISPLAY PANEL
20: PIXEL CIRCUIT
21: ORGANIC EL ELEMENT
100: DISPLAY CONTROL CIRCUIT
200: DISPLAY UNIT
300: GATE DRIVER (SCANNING SIGNAL LINE DRIVE CIRCUIT)
301: SHIFT REGISTER
311: FIRST CONTROL CIRCUIT
312: SECOND CONTROL CIRCUIT
321: FIRST OUTPUT CIRCUIT
322: SECOND OUTPUT CIRCUIT
330: STABILIZATION CIRCUIT
340: RESET CIRCUIT
400: EMISSION DRIVER (LIGHT EMISSION CONTROL LINE DRIVE CIRCUIT)
500: SOURCE DRIVER (DATA SIGNAL LINE DRIVE CIRCUIT)
NS: FIRST SCANNING SIGNAL, FIRST SCANNING SIGNAL LINE
PS: SECOND SCANNING SIGNAL, SECOND SCANNING SIGNAL LINE
EM: LIGHT EMISSION CONTROL SIGNAL, LIGHT EMISSION CONTROL LINE
M1 to M10: TRANSISTOR IN UNIT CIRCUIT
T1: FIRST INITIALIZATION TRANSISTOR
T2: THRESHOLD VOLTAGE COMPENSATION TRANSISTOR
T3: WRITE CONTROL TRANSISTOR
T4: DRIVE TRANSISTOR
T5: POWER SUPPLY CONTROL TRANSISTOR
T6: LIGHT EMISSION CONTROL TRANSISTOR
T7: SECOND INITIALIZATION TRANSISTOR

The invention claimed is:

1. A display device including a pixel circuit including a display element driven by a current, the display device comprising:

a pixel matrix of i rows×j columns including i×j pixel circuits, with i and j being an integer greater than or equal to 2;
i first scanning signal lines;
i second scanning signal lines; and
j data signal lines,
wherein the pixel circuit includes:
the display element;
a drive transistor having a control terminal, a first conductive terminal, and a second conductive terminal, and provided in series with the display element;
a capacitor having one terminal connected to the control terminal of the drive transistor to hold a potential at the control terminal of the drive transistor;
a write control transistor having a control terminal connected to one of the i second scanning signal lines; a first conductive terminal connected to one of the j data signal lines; and a second conductive terminal connected to the first conductive terminal of the drive transistor; and
a threshold voltage compensation transistor having a control terminal connected to one of the i first scanning signal lines; a first conductive terminal connected to the second conductive terminal of the drive transistor; and a second conductive terminal connected to the control terminal of the drive transistor,
the threshold voltage compensation transistor is a thin-film transistor having a channel layer formed using an oxide semiconductor,
the write control transistor is a thin-film transistor having a channel layer formed using low temperature polysilicon,
in the pixel circuit, a period during which a second scanning signal applied to a second scanning signal line connected to the control terminal of the write control transistor is maintained at on level is included in a period during which a first scanning signal applied to a first scanning signal line connected to the control terminal of the threshold voltage compensation transistor is maintained at on level, and
with n being an integer Set ween 2 and i, inclusive, after the threshold voltage compensation transistor in a pixel circuit in an (n−1)th row changes from off state to on state, the threshold voltage compensation transistor in a pixel circuit in an nth row changes from off state to on state, and then after the threshold voltage compensation transistor in the pixel circuit in the (n−1)th row changes from on state to off state, the threshold voltage compensation transistor in the pixel circuit in the nth row changes from on state to off state.

2. The display device according to claim 1, wherein
the threshold voltage compensation transistor is an N-type transistor, and
the write control transistor is a P-type transistor.

3. The display device according to claim 1, wherein the write control transistor in the pixel circuit in the nth row changes from off state to on state at same timing as when the threshold voltage compensation transistor in the pixel circuit in the (n−1)th row changes from on state to off state.

4. The display device according to claim 1, comprising a plurality of initialization power lines configured to supply an initialization voltage, wherein
the pixel circuit includes a first initialization transistor having a control terminal connected to one of the i first scanning signal lines; a first conductive terminal connected to the control terminal of the drive transistor; and a second conductive terminal connected to one of the plurality of initialization power lines, and
with n being an integer between 2 and i, inclusive, a first scanning signal line connected to the control terminal of the first initialization transistor in a pixel circuit in an nth row and a first scanning signal line connected to the control terminal of the threshold voltage compensation transistor in a pixel circuit in an (n−1)th row use a same drive signal.

5. The display device according to claim 1, comprising a plurality of initialization power lines configured to supply an initialization voltage, wherein
the pixel circuit includes a first initialization transistor having a control terminal connected to one of the i first scanning signal lines; a first conductive terminal connected to the control terminal of the drive transistor; and a second conductive terminal connected to one of the plurality of initialization power lines, and
with n being an integer between 3 and i, inclusive, a first scanning signal line connected to the control terminal of the first initialization transistor in a pixel circuit in an nth row and a first scanning signal line connected to the control terminal of the threshold voltage compensation transistor in a pixel circuit in an (n−2)th row use a same drive signal.

6. The display device according to claim 1, wherein with n being an integer between 2 and i, inclusive, a length of a period from a time point at which the threshold voltage compensation transistor in a pixel circuit in an (n−1)th row changes from off state to on state to a time point at which the threshold voltage compensation transistor in a pixel circuit in an nth row changes from off state to on state is equal to a length of a period from a time point at which the write control transistor in the pixel circuit in the (n−1)th row changes from off state to on state to a time point at which the write control transistor in the pixel circuit in the nth row changes from off state to on state.

7. The display device according to claim 1, wherein
a high-level potential applied to the i first scanning signal lines is equal to a high-level potential applied to the i second scanning signal lines, and
a low-level potential applied to the i first scanning signal lines is equal to a low-level potential applied to the i second scanning signal lines.

8. The display device according to claim 1, comprising a plurality of initialization power lines configured to supply an initialization voltage, wherein the display element has a first terminal; and a second terminal to which a low-level power supply voltage is provided,
the pixel circuit includes:
a first initialization transistor having a control terminal connected to one of the i first scanning signal lines; a first conductive terminal connected to the control terminal of the drive transistor; and a second conductive terminal connected to one of the plurality of initialization power lines, and
a second initialization transistor having a control terminal connected to the control terminal of the first initialization transistor in a pixel circuit in a subsequent row; a first conductive terminal connected to the first terminal of the display element; and a second conductive terminal connected to the first conductive terminal of the first initialization transistor in the pixel circuit in the subsequent row, and
the first initialization transistor and the second initialization transistor each are a thin-film transistor having a channel layer formed using an oxide semiconductor.

9. A display device including a pixel circuit including a N-type transistor and a P-type transistor, the display device comprising:
a pixel matrix of i rows×j columns including i×j pixel circuits, with i and j being an integer greater than or equal to 2;
i first scanning signal lines configured to drive the N-type transistor;
i second scanning signal lines configured to drive the P-type transistor;
a scanning signal line drive circuit configured to apply a first scanning signal to the i first scanning signal lines, and apply a second scanning signal to the i second scanning signal lines, the scanning signal line drive circuit including a shift register that includes i unit circuits and that is configured to operate based on a first clock signal and a second clock signal;
a first constant potential line configured to supply a first constant potential; and
a second constant potential line configured to supply a second constant potential higher than the first constant potential,
wherein each of the unit circuits includes a first internal node; a second internal node to which a potential having a same logic level as the first internal node is provided; a first control circuit configured to control a potential at the first internal node; a first output circuit configured to apply the first scanning signal to a corresponding one of the first scanning signal lines; and a second output circuit configured to apply the second scanning signal to a corresponding one of the second scanning signal lines,
to an even-numbered unit circuit there are inputted the first clock signal as a first control clock and inputted the second clock signal as a second control clock,
to an odd-numbered unit circuit there are inputted the second clock signal as the first control clock and inputted the first clock signal as the second control clock,
the first control circuit includes:
an input terminal configured to receive the first control clock; and
an output node connected to the first internal node,
the first output circuit includes:
a first output terminal connected to the corresponding one of the first scanning signal lines;

a first scanning signal turn-on transistor of P-type configured to bring the first scanning signal applied to the first scanning signal line connected to the first output terminal to on level, the first scanning signal turn-on transistor having a control terminal connected to the first internal node; and a first scanning signal turn-off transistor of N-type having a control terminal connected to the first internal node; a first conductive terminal connected to the first output terminal; and a second conductive terminal connected to the first constant potential line, and the second output circuit includes:

a second output terminal connected to another unit circuit and the corresponding one of the second scanning signal lines;

a second scanning signal control transistor of P-type having a control terminal connected to the second internal node; a first conductive terminal to which the second control clock is provided; and a second conductive terminal connected to the second output terminal; and a capacitor having a first terminal connected to the second internal node; and a second terminal connected to the second output terminal.

10. The display device according to claim 9, comprising a clock signal output circuit configured to output the first clock signal and the second clock signal, wherein the first clock signal and the second clock signal are two-phase clock signals that periodically repeat a first period during which a potential having a first level is maintained and a second period during which a potential having a second level higher than the first level is maintained, and with n being an even number, a period during which the second scanning signal applied to a second scanning signal line connected to the second output terminal of an nth unit circuit is maintained at on level corresponds to an (n/2)th first period of the second clock signal with reference to a start time of each vertical scanning period.

11. The display device according to claim 10, wherein a period during which the second scanning signal applied to a second scanning signal line connected to the second output terminal of an (n−1)th unit circuit is maintained at on level corresponds to an (n/2)th first period of the first clock signal with reference to a start time of each vertical scanning period, a period during which the second scanning signal applied to a second scanning signal line connected to the second output terminal of an (n+1)th unit circuit is maintained at on level corresponds to an ((n/2)+1)th first period of the first clock signal with reference to a start time of each vertical scanning period, and a period during which the first scanning signal applied to a scanning signal line connected to the first output terminal of the nth unit circuit is maintained at on level corresponds to a period from a start time of an (n/2)th first period of the first clock signal to a start time of an ((n/2)+1)th first period of the first clock signal with reference to a start time of each vertical scanning period.

12. The display device according to claim 10, wherein the first period is shorter than the second period.

13. The display device according to claim 9, wherein the N-type transistor is a thin-film transistor having a channel layer formed using an oxide semiconductor, and the P-type transistor is a thin-film transistor having a channel layer formed using low temperature polysilicon.

14. The display device according to claim 9, wherein the first control circuit includes a first internal node control transistor of P-type having a control terminal to which the first control clock is provided; a first conductive terminal connected to the second output terminal of another unit circuit; and a second conductive terminal connected to the first internal node.

15. The display device according to claim 9, wherein the first control circuit includes two P-type transistors connected in series between the second output terminal of another unit circuit and the first internal node, and the first control clock is provided to control terminals of the two P-type transistors included in the first control circuit.

16. The display device according to claim 9, wherein a potential at the first internal node is equal to a potential at the second internal node.

17. The display device according to claim 9, wherein each of the unit circuits includes a second control circuit configured to control a potential at the first internal node, the second control circuit includes:

a stabilization circuit including two P-type transistors connected in series between the first internal node and the second constant potential line; and an output circuit control transistor of P-type having a control terminal connected to the first constant potential line; a first conductive terminal connected to the second internal node; and a second conductive terminal connected to the first internal node, the second control clock is provided to a control terminal of a P-type transistor on a first internal node side out of the two P-type transistors included in the stabilization circuit, and a control terminal of a P-type transistor on a second constant potential line side out of the two P-type transistors included in the stabilization circuit is connected to the first output terminal.

18. The display device according to claim 9, wherein each of the unit circuits includes a second control circuit configured to control a potential at the first internal node, the second control circuit includes:

a stabilization circuit including two P-type transistors connected in series between the first internal node and the second constant potential line; and an output circuit control unit including two P-type transistors connected in series between the first internal node and the second internal node, the second control clock is provided to a control terminal of a P-type transistor on a first internal node side out of the two P-type transistors included in the stabilization circuit, a control terminal of a P-type transistor on a second constant potential line side out of the two P-type transistors included in the stabilization circuit is connected to the first output terminal, and control terminals of the two P-type transistors included in the output circuit control unit are connected to the first constant potential line.

19. A display device including a plurality of pixel circuits each including a display element driven by a current, the display device comprising:
- a pixel matrix of i rows×j columns including i×j pixel circuits, with i and j being an integer greater than or equal to 2;
- i first scanning signal lines;
- i second scanning signal lines;
- i light emission control lines;
- j data signal lines;
- a plurality of initialization power lines configured to supply an initialization voltage;
- a first power line configured to supply a low-level power supply voltage; and
- a second power line configured to supply a high-level power supply voltage, wherein each of the plurality of pixel circuits includes:
- the display element having a first terminal; and a second terminal connected to the first power line;
- a drive transistor having a control terminal, a first conductive terminal, and a second conductive terminal, and provided in series with the display element;
- a capacitor having one terminal connected to the control terminal of the drive transistor, and another terminal connected to the second power line;
- a write control transistor having a control terminal connected to one of the i second scanning signal lines; a first conductive terminal connected to one of the j data signal lines; and a second conductive terminal connected to the first conductive terminal of the drive transistor;
- a threshold voltage compensation transistor having a control terminal connected to one of the i first scanning signal lines; a first conductive terminal connected to the second conductive terminal of the drive transistor; and a second conductive terminal connected to the control terminal of the drive transistor,
- a power supply control transistor having a control terminal connected to one of the i light emission control lines; a first conductive terminal connected to the second power line; and a second conductive terminal connected to the first conductive terminal of the drive transistor;
- a light emission control transistor having a control terminal connected to one of the i light emission control lines; a first conductive terminal connected to the second conductive terminal of the drive transistor; and a second conductive terminal connected to the first terminal of the display element;
- a first initialization transistor having a control terminal connected to one of the i first scanning signal lines; a first conductive terminal connected to the control terminal of the drive transistor; and a second conductive terminal connected to one of the plurality of initialization power lines; and
- a second initialization transistor having a control terminal connected to the control terminal of the first initialization transistor in a pixel circuit in a subsequent row; a first conductive terminal connected to the first terminal of the display element; and a second conductive terminal connected to the first conductive terminal of the first initialization transistor in the pixel circuit in the subsequent row, and the first initialization transistor and the second initialization transistor each are a thin-film transistor having a channel layer formed using an oxide semiconductor.

\* \* \* \* \*

UNITED STATES PATENT AND TRADEMARK OFFICE
CERTIFICATE OF CORRECTION

| | |
|---|---|
| PATENT NO. | : 11,823,623 B2 |
| APPLICATION NO. | : 17/642785 |
| DATED | : November 21, 2023 |
| INVENTOR(S) | : Kaoru Yamamoto |

It is certified that error appears in the above-identified patent and that said Letters Patent is hereby corrected as shown below:

On the Title Page

In item (87), "PCT Pub. No.: WO2021/053770" should be corrected to:
--PCT Pub. No.: WO2021/053707--

Signed and Sealed this
Twenty-sixth Day of December, 2023

Katherine Kelly Vidal
*Director of the United States Patent and Trademark Office*